(12) United States Patent
Iwahashi

(10) Patent No.: US 6,301,158 B1
(45) Date of Patent: *Oct. 9, 2001

(54) NONVOLATILE SEMICONDUCTOR MEMORY DEVICE

(75) Inventor: Hiroshi Iwahashi, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/079,912

(22) Filed: May 15, 1998

(30) Foreign Application Priority Data

May 16, 1997 (JP) .................................. 9-126137

(51) Int. Cl.[7] .................................. G11C 16/06
(52) U.S. Cl. .................... 365/185.23; 365/185.05
(58) Field of Search ................ 365/185.23, 185.05, 365/185.18, 189.04

(56) References Cited

U.S. PATENT DOCUMENTS

| | | | |
|---|---|---|---|
| 4,301,518 | 11/1981 | Klaas | 365/185 |
| 5,027,321 | 6/1991 | Park | 365/185 |
| 5,216,633 * | 6/1993 | Weon | 365/189.12 |
| 5,448,518 | 9/1995 | Jinbo | 365/185 |
| 5,777,922 * | 7/1998 | Choi et al. | 365/185.23 X |
| 5,796,652 * | 8/1998 | Takeshima et al. | 365/185.23 X |
| 5,844,839 * | 12/1998 | Smayling et al. | 365/185.23 |

* cited by examiner

Primary Examiner—A. Zarabian
(74) Attorney, Agent, or Firm—Hogan & Hartson, LLP

(57) ABSTRACT

A virtual grounded type EEPROM including a memory cell array includes a plurality of memory cells arranged in a matrix. A control gates of the memory cells of the same row are connected to one of word lines. The adjacent two memory cells of the same row are connected such that a drain of one of them is connected to a source of the other. The source and drain of the adjacent two memory cells are connected to one of bit lines. A row decoder selects one of the word lines and a column decoder selects one of the bit lines. A program circuit applies a high voltage to the drain of a selected memory cell. The row decoder determines whether a high voltage should be applied to the selected word line. The row decoder also determines whether or not to permit the charge storage layer to store charges. The data programming is executed such that data programming for the memory cells of one column is completed first and then data programming for the memory cells of an adjacent column is started, and such that data programming makes progress from the memory cells at one end of each memory cell array to the memory cells at the other end of the memory cell array.

42 Claims, 17 Drawing Sheets

| A2 | A1 | A0 | WL1 | WL2 | WL3 | WL4 | WL5 | WL6 | WL7 | WL8 |
|----|----|----|-----|-----|-----|-----|-----|-----|-----|-----|
| 0  | 0  | 0  | 1   | 0   | 0   | 0   | 0   | 0   | 0   | 0   |
| 0  | 0  | 1  | 0   | 1   | 0   | 0   | 0   | 0   | 0   | 0   |
| 0  | 1  | 0  | 0   | 0   | 1   | 0   | 0   | 0   | 0   | 0   |
| 0  | 1  | 1  | 0   | 0   | 0   | 1   | 0   | 0   | 0   | 0   |
| 1  | 0  | 0  | 0   | 0   | 0   | 0   | 1   | 0   | 0   | 0   |
| 1  | 0  | 1  | 0   | 0   | 0   | 0   | 0   | 1   | 0   | 0   |
| 1  | 1  | 0  | 0   | 0   | 0   | 0   | 0   | 0   | 1   | 0   |
| 1  | 1  | 1  | 0   | 0   | 0   | 0   | 0   | 0   | 0   | 1   |

WHERE D="1"

| A2 | A1 | A0 | WL1 | WL2 | WL3 | WL4 | WL5 | WL6 | WL7 | WL8 |
|----|----|----|-----|-----|-----|-----|-----|-----|-----|-----|
| 0  | 0  | 0  | 0   | 0   | 0   | 0   | 0   | 0   | 0   | 0   |
| 0  | 0  | 1  | 0   | 0   | 0   | 0   | 0   | 0   | 0   | 0   |
| 0  | 1  | 0  | 0   | 0   | 0   | 0   | 0   | 0   | 0   | 0   |
| 0  | 1  | 1  | 0   | 0   | 0   | 0   | 0   | 0   | 0   | 0   |
| 1  | 0  | 0  | 0   | 0   | 0   | 0   | 0   | 0   | 0   | 0   |
| 1  | 0  | 1  | 0   | 0   | 0   | 0   | 0   | 0   | 0   | 0   |
| 1  | 1  | 0  | 0   | 0   | 0   | 0   | 0   | 0   | 0   | 0   |
| 1  | 1  | 1  | 0   | 0   | 0   | 0   | 0   | 0   | 0   | 0   |

WHERE D="0"

| DIN | W | R | D |
|-----|---|---|---|
| 0   | 0 | 0 | 0 |
| 1   | 0 | 0 | 0 |
| 0   | 1 | 0 | 0 |
| 1   | 1 | 0 | 1 |
| 0   | 0 | 1 | 1 |
| 1   | 0 | 1 | 1 |

D=R*/W+/R*DIN*W i=1,2   D1=R*/W+/R*DIN1*W

NONVOLATILE SEMICONDUCTOR MEMORY DEVICE

BACKGROUND OF THE INVENTION

The present invention relates to a nonvolatile semiconductor memory device, more specifically to a flash EEPROM in which a memory cell is made of an MOSFET comprising both a floating gate and a control gate, and data is stored based on the amount of charges stored in the floating gate. In particular, the present invention is directed to a virtual grounded type flash EEPROM.

This application is based on Japanese Patent Application No. 9-126137, filed May 16, 1997, the content of which is incorporated herein by reference.

FIG. 1 shows the memory cell array of a conventional flash EEPROM. FIG. 2A is a plan view showing part of the memory cell array depicted in FIG. 1, and FIG. 2B is a sectional view taken along line 2B—2B in FIG. 2A. In FIG. 2B, illustration of an oxide film is omitted.

In the conventional flash EEPROM shown in FIG. 1 and FIGS. 2A and 2B, data is written in a memory cell by applying a high voltage to a word line (row line) WL and a bit line (column line) BL and applying a reference potential (e.g., a ground potential) to the common source VSS of memory cells. Since, therefore, a current is allowed to flow through the memory cell, charges are injected in the floating gate. When data is erased from the memory cell, charges are injected in the floating gates of all memory cells. After the floating gates of all memory cells are thereby set in a uniform state, all word lines are set at the reference potential level. In this state, a high voltage is applied to the common source VSS of the memory cells, and charges are thereby made to emit from the floating gates to the source by utilization of a tunnel effect, thereby erasing data from the memory cell.

In this type of EEPROM, the bit lines BL are formed of aluminum, and the drain regions of adjacent two memory cells are commonly connected to the bit line. Due to this structure, the area used for connection is inevitably wide and gives rise to a low manufacturing yield.

In consideration of the above circumstances, flash EEPROMs having a virtual grounded structure are under development. FIG. 3 shows the memory cell array of such a flash EEPROM. FIG. 4A is a plan view showing part of the memory cell array shown in FIG. 3, and FIG. 4B is a sectional view taken along line 4B—4B in FIG. 4A.

In the EEPROM having a virtual grounded structure, $N^+$ regions, used as sources and drains of memory cells, are connected to bit lines BL1–BL9 (i.e., column lines). Since the bit lines BL1 to BL9 are formed in those $N^+$ regions which are under control gates CG, it is not necessary to provide a connection element to connect the bit lines BL1–BL9 and the memory cells 11–88 together, unlike the memory cells shown in FIGS. 2A and 2B. Accordingly, the memory cell area can be reduced, and the connection between the bit lines and memory cells does not lower the manufacturing yield.

A description will now be given as to how data is written in a memory cell of the EEPROM of a virtual grounded structure, with charges stored in the floating gate of the memory cell. By way of example, let us consider the case where data is written in memory cell 12. In this case, a high voltage is applied to both word line WL1 (i.e., a row line) and bit line BL2, thereby setting bit line BL3 at a reference potential level (e.g., a ground potential level). In this state, a current flows through the memory cell 12, thus permitting the floating gate to store charges. Although the bit line BL1 is in the electrically floated condition at the time, the memory cell 11 is turned on due to the high voltage applied to the word line WL1. Since the high voltage is applied to the bit line BL2, the bit line BL1 is charged through the memory cell 11 in an amount corresponding to the parasitic capacitance of the bit line BL1. In order to prevent the floating gate of the memory cell 11 to store charges in spite of the charged state of the bit line BL1, an offset transistor $T_{off}$ is provided for each of the memory cells, as shown in FIG. 4B. The offset transistor $T_{off}$ has its channel portion controlled by the control gate CG. Even when data is written in the memory cell 12, the offset transistor $T_{off}$ connected to the bit line BL2 to which a high voltage is applied, serves to prevent the floating gate FG of the memory cell 11 from storing charges.

At the same time, however, the use of the offset transistor $T_{off}$ inevitably increases the memory cell size because the offset transistor $T_{off}$ is incorporated in the memory cell.

BRIEF SUMMARY OF THE INVENTION

Accordingly, it is an object of the present invention to provide a nonvolatile semiconductor memory device of a virtual grounded type, which does not comprise a connection element to connect the bit lines and memory cells, and which further eliminates the need to provide an offset transistor for each memory cell.

Another object of the present invention is to provide a novel method for writing data in a memory cell of a nonvolatile semiconductor memory device of a virtual grounded type.

According to the first aspect of the present invention, there is provided a nonvolatile semiconductor memory device comprising a plurality of word lines; a plurality of bit lines; a memory cell array having a plurality of memory cells arranged in a matrix, each of the memory cells including a charge storage layer, a control gate, a drain, a source, and a channel region, and storing data based on the amount of charges stored in the charge storage layer, the control gates of the memory cells of one row are connected to one of the word lines, adjacent ones of the memory cells of one row being connected such that the drain of one of the adjacent ones is connected to the source of the other, adjacent ones of the memory cells of one column being connected such that the drain of one of the adjacent ones and the source of the other are connected to one of the bit lines; a row decoder, supplied with an address signal, for selecting one of the word lines; a column decoder, supplied with an address signal, for selecting one of the bit lines; and a program circuit for programming data in the memory cells, the program circuit executing data programming such that data programming for the memory cells of one column is completed first and then data programming for the memory cells of an adjacent column is started, and such that data programming makes progress from the memory cells at one end of the memory cell array to the memory cells at the other end of the memory cell array.

In the manner described above, the programming for the memory cell array is executed, first with respect to the memory cells corresponding to the bit line at one end, and makes progress from that bit line to the adjacent one. When the memory cells corresponding to the adjacent bit line are being programmed, it is possible to prevent data from being mistakenly written in the memory cells corresponding to the bit line arranged at the end. Accordingly, it is not necessary to connect offset transistors.

According to the nonvolatile semiconductor memory device of the second aspect of the present invention which is a modification of the first aspect, the row decoder receives program data to be written in the memory cells, a high voltage is applied to the word line selected in accordance with an address signal such that the voltage application is based on the program data, and control is executed whether or not to permit the charge storage layer to store charges.

Owing to this feature, a high voltage can be applied to a word line corresponding to a memory cell in which data "1" is written.

According to the nonvolatile semiconductor memory device of the third aspect of the present invention which is a modification of the first or second aspect, there is further provided a column selecting circuit that causes the row decoder to control the connection between the bit lines and the program circuit. Assuming that the adjacent three bit lines are arranged in the order of a first bit line, a second bit line and a third bit line, the program circuit applies a high voltage to the first bit line through the column selecting circuit and applies a reference potential to the second bit line. By this operation, the memory cell whose drain is connected to the first bit line and whose source is connected to the second bit line is programmed. After this memory cell is programmed, the program circuit applies a high voltage to the second bit line through the column selecting circuit and applies a reference potential to the third bit line. By this operation, the memory cell whose drain is connected to the second bit line and whose source is connected to the third bit line is programmed.

According to the nonvolatile semiconductor memory device of the fourth aspect of the present invention which is a modification of the third aspect, the program circuit applies a high voltage both to the first bit line and to the bit line to which the programmed memory cells are connected, so as to program the memory cell whose drain is connected to the second bit line and whose source is connected to the third bit line.

By this operation, the bit lines to which the programmed memory cells are connected are set at the high voltage level. Even when a high voltage is applied to a word line of a memory cell so as to program the memory cells of the adjacent column, no current flows to the programmed memory cells.

According to the nonvolatile semiconductor memory device of the fifth aspect of the present invention which is a modification of the third aspect, the program circuit opens or electrically disconnects the first bit line and the bit line to which the programmed memory cells are connected, so as to program the memory cell whose drain is connected to the second bit line and whose source is connected to the third bit line.

By this operation, no current flows to the programmed memory cells.

According to the nonvolatile semiconductor memory device of the sixth aspect of the present invention which is a modification of the second aspect, there is further provided a power supply voltage-applying means that can vary the level of the power source voltage applied to the row decoder. When data is programmed in the memory cell, the power supply voltage-applying means generates a voltage corresponding to the data programmed in the memory cell and applies this voltage to the selected word line.

According to the nonvolatile semiconductor memory device of the seventh aspect of the present invention which is a modification of the sixth aspect, the power supply voltage-applying means applies the row decoder with a voltage lower than the power supply voltage applied at the time of normal data reading, when the data erased state of the memory cell is checked after the data programmed in the memory cell is erased.

The power supply voltage lower than that applied for normal data reading is applied at the time of checking the data erased state, and the erasing operation is repeated until the memory cell is turned on. The power supply voltage applied when the memory cell has just been turned on is detected and used for determining the threshold voltage which is applied to the memory cell at the time of data erasing.

According to the nonvolatile semiconductor memory device of the eighth aspect of the present invention which is a modification of the second aspect, the row decoder simultaneously programs data in those memory cells that are connected to a plurality of word lines selected in accordance with the address signal.

According to the nonvolatile semiconductor memory device of the ninth aspect of the present invention which is a modification of the eight aspect, the row decoder comprises a latch circuit for holding data which is to be written in the memory cells connected to the selected word lines.

Due to the use of the latch circuit, serially-supplied different data can be simultaneously supplied to a plurality of word lines.

According to the tenth aspect of the present invention, there is provided a nonvolatile semiconductor memory device comprising a plurality of memory cell arrays each having a plurality of memory cells arranged in matrix, each of the memory cells including a charge storage layer, a control gate, a drain, a source and a channel region, and storing data based on the amount of charges stored in the charge storage layer, the control gates of the memory cells of one row being connected to one of the word lines, adjacent ones of the memory cells of one row being connected such that the drain of one of the adjacent ones is connected to the source of the other, adjacent ones of the memory cells of one column being connected such that the drain of one of the adjacent ones and the source of the other are connected to one of first bit lines; a plurality of second bit lines used in common to the memory cell arrays; switching transistors having a first end which is connected to the second bit lines used in common to the memory cell arrays and to the first bit lines of the memory cell arrays, and a second end which is connected to the second bit lines; a row decoder, supplied with an address signal, for selecting one of the word lines; a column decoder, supplied with an address signal, for selecting one of the second bit lines; and a program circuit for programming data in the memory cells, the program circuit executing data programming such that data programming for the memory cells of one column is completed first and then data programming for the memory cells of an adjacent column is started, and such that data programming makes progress from the memory cells at one end of each memory cell array to the memory cells at the other end of the same memory cell array.

In the device of the tenth aspect, the memory cells are divided into a plurality of memory cell arrays. Even where the storage capacity of the memory device is large, the number of memory cells connected to one bit line need not be increased, and the parasitic capacitance of the bit line does not increase.

According to the nonvolatile semiconductor memory device of the eleventh aspect of the present invention which is a modification of the tenth aspect, the switching transistors are connected to one end of each of the bit lines extending in the same direction.

Owing to this feature, only one signal line that is connected to the gate of the switching transistors suffices to control the ON/OFF state of the switching transistors. Accordingly, the switching transistors do not require a wide installation area.

According to the nonvolatile semiconductor memory device of the twelfth aspect of the present invention which is a modification of the tenth aspect, the switching transistors are provided at both ends of the bit lines, and both the switching transistors, used for selecting corresponding memory cell arrays, are connected to the second bit lines.

Due to this feature, the bit lines are charged or discharged at the two ends, thus reducing the resistance of the bit lines.

According to the nonvolatile semiconductor memory device of the thirteenth aspect of the present invention which is a modification of one of the tenth to twelfth aspects, the switching transistors of the memory cell arrays are simultaneously selected so as to execute simultaneous programming for the memory cell arrays.

According to the fourteenth aspect of the present invention, there is provided a nonvolatile semiconductor memory device comprising a memory cell array including a plurality of memory cells, each of the memory cells having a first conductivity type semiconductor substrate, second conductivity type drain and source regions formed on the first conductivity type semiconductor substrate, a charge storage layer formed in a channel region between the drain and source regions, with an insulating film interposed, and a control gate formed on the charge storage layer, with an insulating film interposed; a plurality of word lines connected to the control gates of the memory cells of one row; a plurality of bit lines connected in common to the drain and source regions of the memory cells of one column; and a conductive film formed on the memory cell array, with an insulating film interposed.

According to the fourteenth aspect, the conductive film, which is biased and set at a predetermined potential level, is formed on top of the memory cells, with an insulating film interposed. The conductive film prevents an inversion layer from being formed in the semiconductor substrate surface portion which is between the bit lines and at which no control gate is present. Accordingly, no leak current flows between the memory cells.

According to the fifteenth aspect of the present invention, there is provided a nonvolatile semiconductor memory device comprising a plurality of memory cell arrays each made up of a plurality of memory cells, each of the memory cells including a first conductivity type semiconductor substrate, second conductivity type drain and source regions formed on the first conductivity type semiconductor substrate, a charge storage layer formed in a channel region between the drain and source regions, with an insulating film interposed, and a control gate formed on the charge storage layer, with an insulating film interposed; a plurality of word lines connected to the control gates of the memory cells of one row; a plurality of first bit lines connected in common to the drain and source regions of the memory cells of one column of each memory cell array; a plurality of switching transistors having first ends which are connected to first ends of the first bit lines; second bit lines formed on the memory cell arrays, with an insulating film interposed, and connected to second ends of the switching transistors; and a conductive film formed on the memory cell array and the second bit lines, with an insulating film interposed.

In the device of the fifteenth aspect, a conductive film, which is biased and set at a predetermined potential level, is formed on top of the memory cells, with an insulating film interposed. The conductive film prevents an inversion layer from being formed in the semiconductor substrate surface portion which is between the bit lines and at which no control gate is present. Accordingly, no leak current flows between the memory cells.

According to the nonvolatile semiconductor memory device of the sixteenth aspect which is a modification of one of the fourteen and fifteenth aspect, the conductive film is applied with a predetermined potential. Owing to application of this potential, an inversion layer is prevented from being formed in the semiconductor substrate surface portion which is between the bit lines and at which no word line is present. Accordingly, no current path is not formed between the adjacent bit lines.

With the structure of the device of the sixteenth aspect, an inversion layer, which may cause a leak current, is not formed on a semiconductor surface portion even if the semiconductor surface portion is in the region which is between the bit lines and defined by a diffusion layer and at which no control gate is provided.

According to the nonvolatile semiconductor memory device of the seventeenth aspect which is a modification of one of the fourteenth to sixteenth aspects, there is further provided a row decoder, supplied with an address signal, for selecting one of the word lines; a column decoder, supplied with an address signal, for selecting one of the bit lines; and a program circuit for programming data in the memory cells. The program circuit executes data programming such that data programming for the memory cells of one column is completed first and then data programming for the memory cells of an adjacent column is started, and such that data programming makes progress from the memory cells at one end of the memory cell array to the memory cells at the other end of the same memory cell array.

Due to the features above, the memory device according to the seventeenth aspect does not require a wide installation space and can be controlled with high efficiency.

According to the eighteenth aspect of the present invention, there is provided a nonvolatile semiconductor memory device comprising a plurality of word lines; a plurality of bit lines; a memory cell array made up of a plurality of memory cells, each of the memory cells having a charge storage layer, a control gate, a drain, a source, and a channel region, and storing data in accordance with the amount of charges stored in the charge storage layer, the memory cells being arranged in a matrix pattern of row and column directions, the control gates of the memory cells of one row being connected to one of the word lines, adjacent ones of the memory cells of one row being connected such that the drain of one of the adjacent ones is connected to the source of the other, the memory cells of one column being connected such that the drains and sources thereof are connected in common to one of the bit lines; a row decoder, supplied with an address signal, for selecting one of the word lines; a column decoder, supplied with an address signal, for selecting one of the bit lines; and a program circuit for programming data in the memory cells, the program circuit applying a high voltage to the drain of a selected memory cell, the row decoder receiving program data to be written in the memory cells and determining whether a high voltage should be applied to the word line selected in accordance with an address signal such that the voltage application is based on the program data, and control is executed whether or not to permit the charge storage layer to store charges.

In a nonvolatile semiconductor memory device of a virtual grounded type provided by the present invention, the programming of memory cells is performed by turning on or off the control gates, with the drains kept at a high potential level. Since the storage of charges in the floating gates is thus controlled selectively, it is not necessary to employ offset transistors. Accordingly, the installation area for the memory cells can be reduced, and the manufacturing yield is improved.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 shows an example of a truth table used when signals output from the row decoder depicted in FIG. 5 are programmed, erased and read out;

FIG. 7 shows another example of the truth table used when signals output from the row decoder depicted in FIG. 5 are programmed, erased and read out;

DETAILED DESCRIPTION OF THE INVENTION

A preferred embodiment of a nonvolatile semiconductor devices according to the present invention will now be described with reference to the accompanying drawings.

(First Embodiment)

Figure 1:
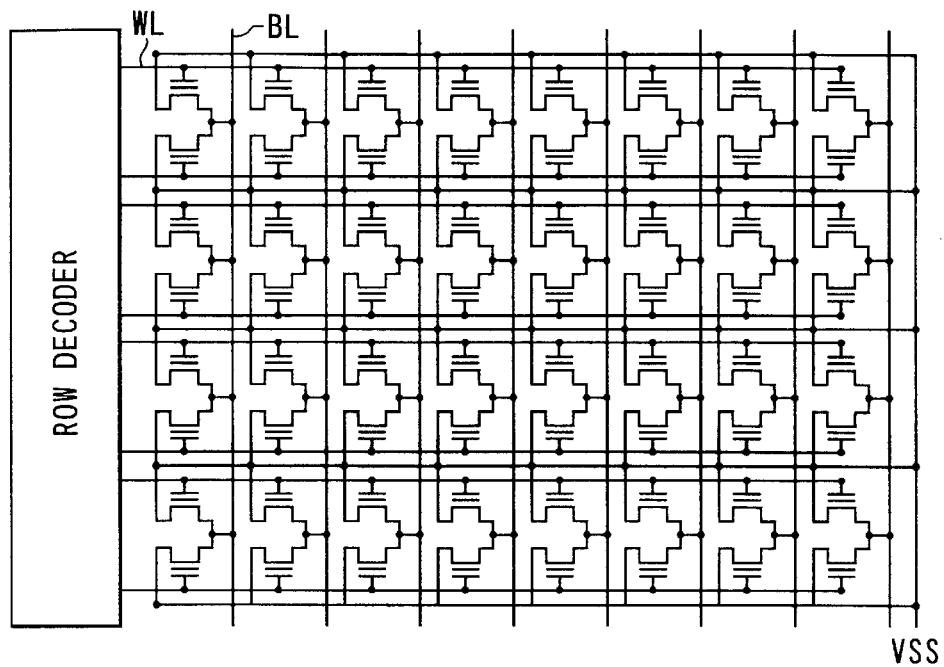
FIG. 1 shows a conventional memory cell array.
Figure 2A:
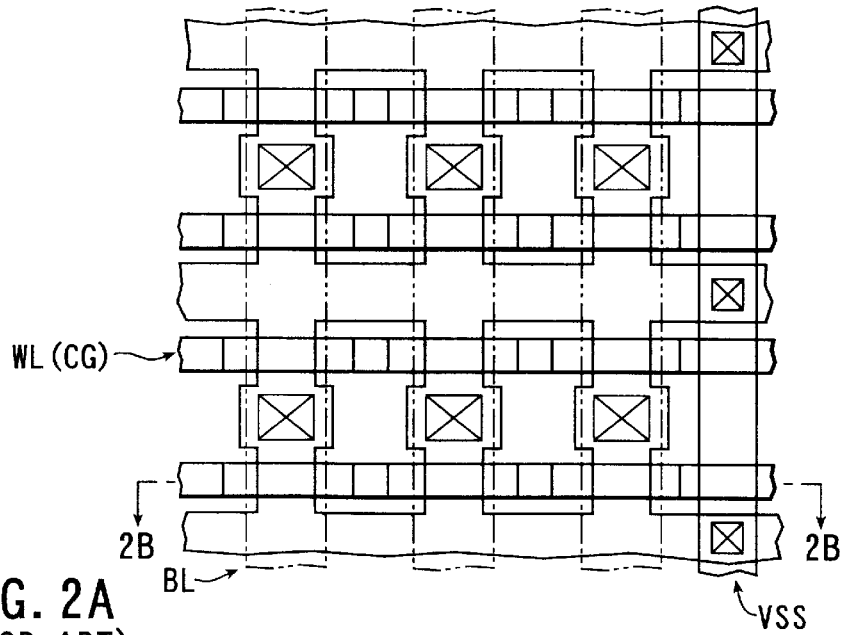
FIGS. 2A and 2B are plan and sectional views, respectively, of the memory cell array depicted in FIG. 1.
Figure 2B:
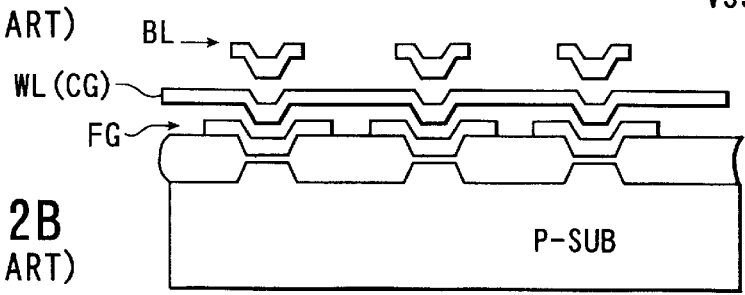
Figure 3:
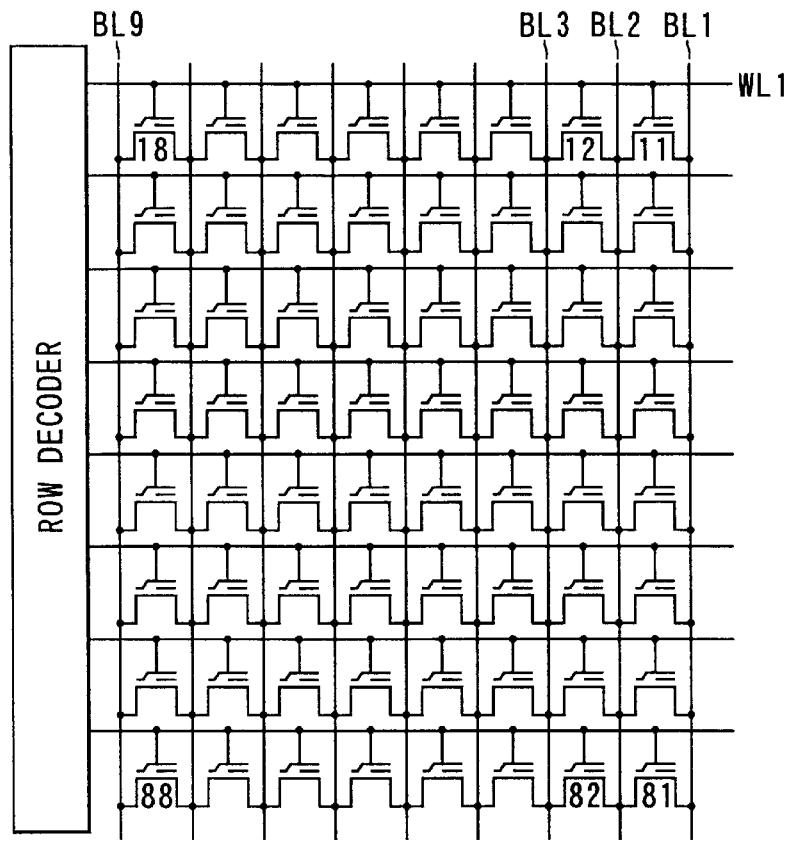
FIG. 3 is a conventional memory cell array of a virtual grounded type.
Figure 4A:
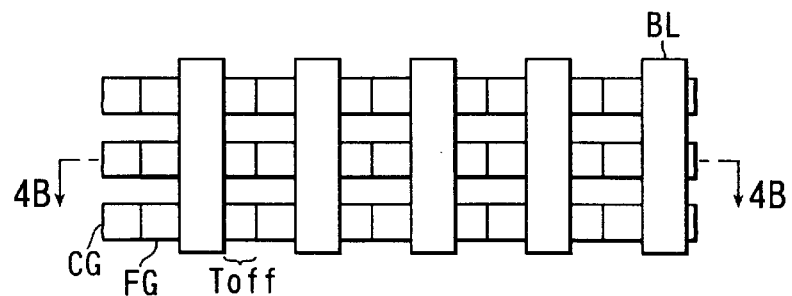
FIGS. 4A and 4B are plan and sectional views, respectively, of the conventional memory cell array of virtual grounded type.
Figure 4B:
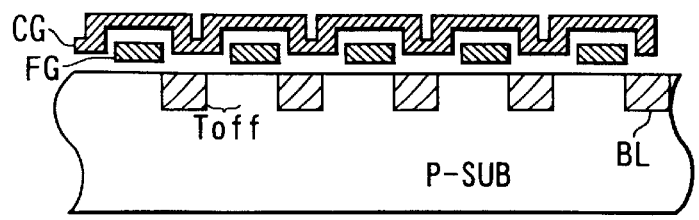
Figure 5:
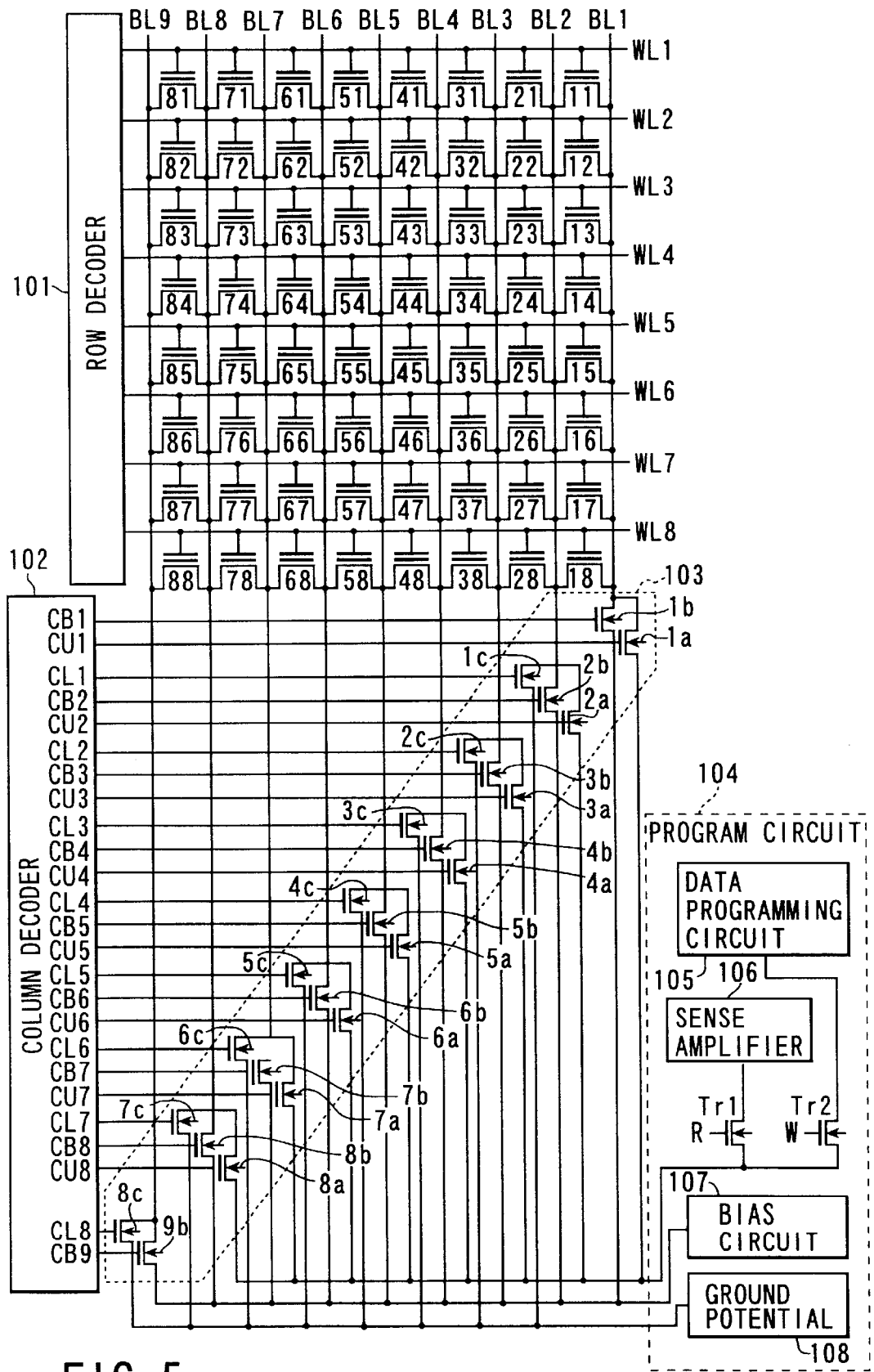
FIG. 5 is a circuit diagram of the nonvolatile semiconductor memory device according to the first embodiment of the present invention.

FIG. 5 is a block circuit diagram showing the structure of the first embodiment. In FIG. 5, the memory cells are illustrated as being arranged in the matrix pattern of 8 rows×8 columns, for the purpose of simplicity. The memory cells of the same row are connected to one of word lines WL1–WL8. The memory cells of the same column have their drains connected to one of bit lines and have their sources connected to another one of the bit lines. For example, the drains of the memory cells 11–18 in the rightmost column in FIG. 5 are connected to bit line BL1, and the sources of them are connected to bit line BL2. This bit line, BL2, is also connected to the drains of the memory cells 21–28 of the adjacent column. The word lines WL1–WL8 are connected to a row decoder 101. The bit lines BL1–BL9 are connected to a program circuit 104 through a bit line selection circuit 103, which is controlled based on output signals from a column decoder 102.

The column selection circuit (or bit line selection circuit) 103 is made up of a plurality of N-channel transistors. The drains of transistors 1a and 1b are connected to bit line BL1. The drains of transistors 2a, 2b and 1c are connected to bit line BL2. Similarly, the drains of transistor (3a, 3b and 2c), (4a, 4b and 3c), (5a, 5b and 4c), (6a, 6b and 5c), (7a, 7b and 6c), and (8a, 8b and 7c) are connected to bit lines BL3, BL4, BL5, BL6, BL7 and BL8, respectively. The drains of transistors 9b and 8c are connected to bit line BL9. Control signals CU1 to CU8 output from the column decoder 102 are supplied to the gates of transistors 1a to 8a, respectively; control signals CB1 to CB9 also output from the column decoder 102 are supplied to the gates of transistors 1b to 9b, respectively; and control signals CL1–CL8 also output from the column decoder 102 are supplied to the gates of transistors 1c to 8c, respectively.

The program circuit 104 is made up of a data programming circuit 105, a sense amplifier 106, a bias circuit 107, and a ground potential circuit 108. The data programming circuit 105 is connected to transistors 1a–8a of the column selection circuit 103 through an N-channel transistor Tr2, which is ON/OFF controlled by a signal W. Likewise, the sense amplifier 106 is connected to transistors 1a–8a of the column selection circuit 103 through an N-channel transistor Tr1, which is ON/OFF controlled by a signal R. The bias circuit 107 is connected to transistors 1b–9b of the column selection circuit 103. The ground potential circuit 108 is connected to transistors 1c–8c of the column selection circuit 103.

Data is written or programmed, first in the memory cells arranged in an end column (either the right end column or the left end column) of the memory cell array. After the programming is completed with respect to the memory cells of that column, it is started with respect to the memory cells of the adjacent column (the reason for this operation will be described later). For example, the programming is started, first with respect to the memory cells connected to bit line BL1, then with respect to the memory cells connected to bit line BL2, and then with respect to the memory cells connected to bit lines BL3, BL4 . . . In the case where the programming is started first with respect to the memory cells connected to bit line BL9, the programming is completed for these memory cells, and then it is started with respect to the memory cells connected to bit line BL8. Subsequently, the execution of programming is continued with respect to the memory cells connected to bit lines BL7, BL6 . . . However, as will be described below, the programming need not be started from an end of the memory cell array. Although the programming is preferably started from an end of the memory cell array, it may be started from an arbitrary position in an arbitrary order.

Although the present invention is an EEPROM of virtual grounded type, its memory cells are not provided with offset transistors. When data is programmed in memory cell 12, therefore, a high voltage is applied to the bit line to which the drain of the selected memory cell is connected, and a reference potential (e.g., a ground potential) is applied to the source of the selected memory cell. When charges are injected into the floating gate of the selected memory cell, a high voltage is applied to the control gate of the selected memory cell, i.e., to the word line to which the selected memory cell is connected. Due to the application of the high voltage, current flows through the channel of the memory cell, and the charges in the channel region injects into the floating gate. When charges are not injected into the floating gate of the selected memory cell (i.e., in the case where the floating gate is kept erased), a reference potential (e.g., a ground potential) is applied to the selected word line.

A description will be given as to how a data erasing operation and a data programming operation are executed in the nonvolatile semiconductor memory device of the present invention.

Prior to the programming of data in memory cells (the writing of data), data is erased from the memory cells. In other words, the memory cells are initialized before data is programmed therein. To be more specific, all memory cells are made to store one of the values of binary data. In this state, programming is performed by writing the other value of the binary data in selected ones of the memory cells.

Prior to the erasing of data, the floating gates of the memory cells from which data is to be erased are made to store charges. In other words, the memory cells from which data is erased are set in the same initial state, and then data is erased therefrom. By this operation, the threshold voltages which the memory cells have after the data erasing can be as uniform as possible. With respect to the memory cells which have not yet subjected to the erasing of data, the injection of charges is performed in a similar manner to that of the injection of charges executed for data programming. That is, a high voltage is applied to bit line BL1, with bit line BL2 set at a reference potential level. In this state, a high voltage is sequentially applied to word lines WL1 to WL8, thereby permitting memory cells 11 to 18 to store charges. Then, a high voltage is applied to bit line BL2, with bit line BL3 set at the reference potential level. In this state, a high voltage is sequentially applied to word lines W1 to WL8, thereby permitting memory cells 21 to 28 to store charges. Subsequently, this operation is repeated with respect to bit lines BL3 to BL9, so as to cause the floating gates of all memory cells to store charges. Alternatively, all bit lines are set at the reference potential level, and all word lines are set at a high potential level. By this operation, charges inject from the channel regions to the floating gates due to the tunneling effect. After the floating gates are made to store charges, all word lines are set at the reference potential level, and a high voltage is applied to the bit lines. Due to the application of this high voltage, the charges are made to emit from the floating gates, and the floating gates are thus discharged due to the tunneling effect.

After this discharge operation, a reading operation for verification (hereinafter called a verify-reading operation) is executed to check whether the amount of charges emitted from the floating gates is sufficient. If this amount is insufficient, the discharge operation described above is executed further. The discharge operation and the verify-reading operation are continued until the threshold voltages of the memory cells become optimal. During the verify-reading operation executed to check or verify the erased state, the voltage applied to the word lines (i.e., the voltage applied to the control gates of the memory cells) is preferably lower than the voltage applied in the normal data reading operation. The memory cells are checked to see if they are turned on by application of that low voltage. If the memory cells are turned on, it follows that the threshold voltages of the memory cells are lower than the voltage applied to the word lines. Accordingly, the voltage applied to the word lines can be used as a reference in determining the threshold voltages which the memory cells should have after the end of data erasing operation.

In the row decoder shown in FIG. 8 (which will be described later), power supply voltage V1 is applied to the selected row. Therefore, the configuration of the row decoder can be simple by controlling the power supply voltage V1 to differ between the time when a normal read operation is performed and the time when a verify-read operation is performed. To be more specific, a power supply voltage applying means that can generate power supply voltages of different levels, one for the normal read operation and the other for the verify-read operation, may be provided, though such a power supply voltage applying means is not shown in FIG. 8. Where such a voltage applying means is provided, its output V1 is applied to the row decoder shown in FIG. 8. Bit lines BL1 to BL9 are connected to the first ends of the current paths of the transistors 1b to 9b whose gates are controlled based on signals CB1 to CB9. The second ends of the current paths of those transistors 1b to 9b are connected together and led to the bias circuit 107. As will be described later, the bias circuit 107 outputs a voltage which is at such a high level as enables the erasing of data at the time of data erasing, and outputs a voltage which is at a predetermined level at the time of data reading. Bit lines BL1 to BL8 are connected to the first ends of the current paths of the transistors 1a to 8a whose gates are controlled based on signals CU1 to CU8. The second ends of the current paths of those transistors 1a to 8a are connected together. They are connected to the sense amplifier 106 through transistor Tr1, which is turned on at the time of data reading. They are also led to the data programming circuit 105 through transistor Tr2, which is turned on at the time of data programming (i.e., data writing). Bit lines BL2 to BL9 are connected to the first ends of the current paths of the transistors 1c to 8c whose gates are controlled based on signals CL1 to CL8. The second ends of the current paths of those transistors 1c to 8c are connected together and led to the ground potential circuit 108.

Figure 6:
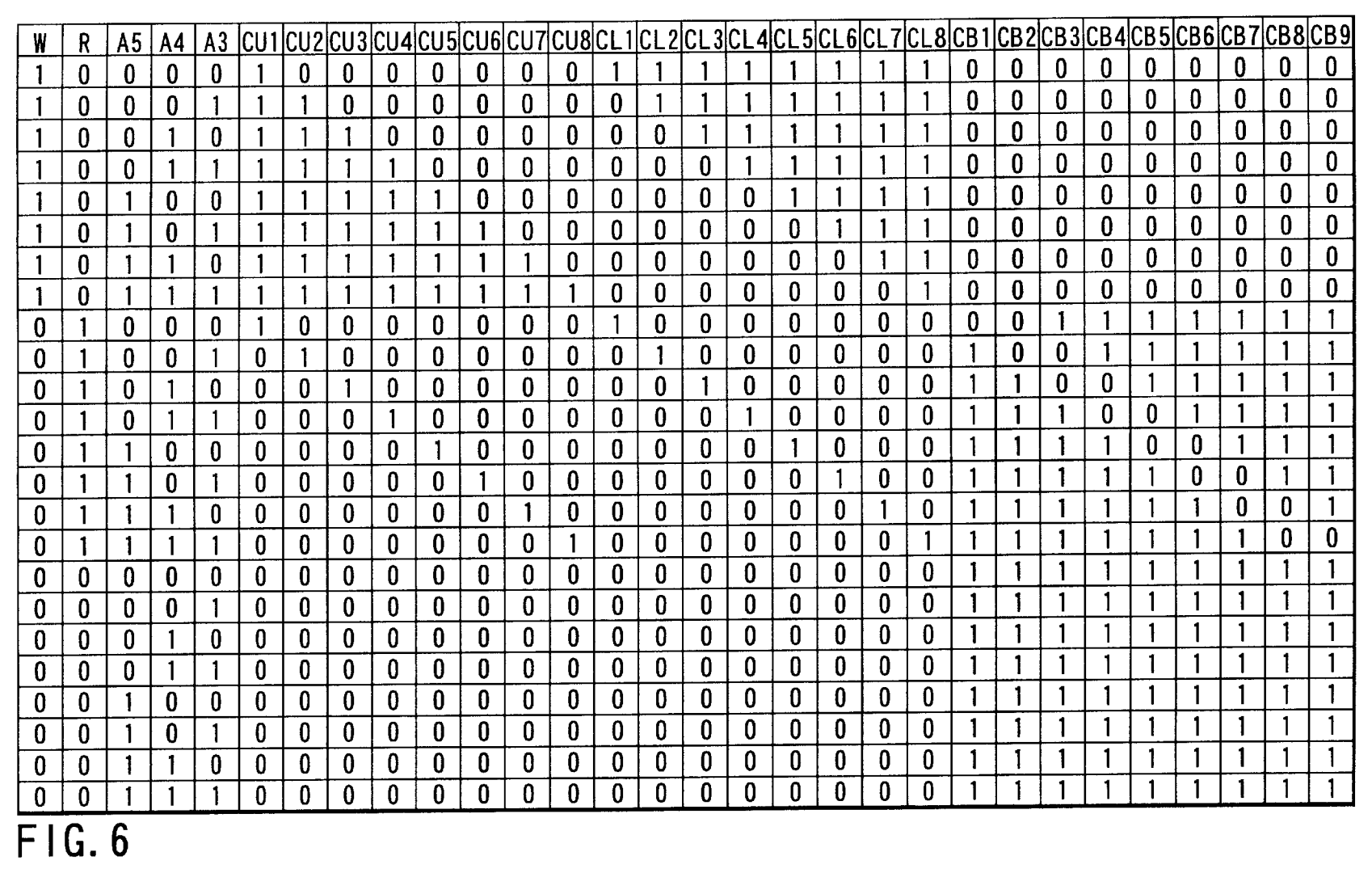
Figure 7:
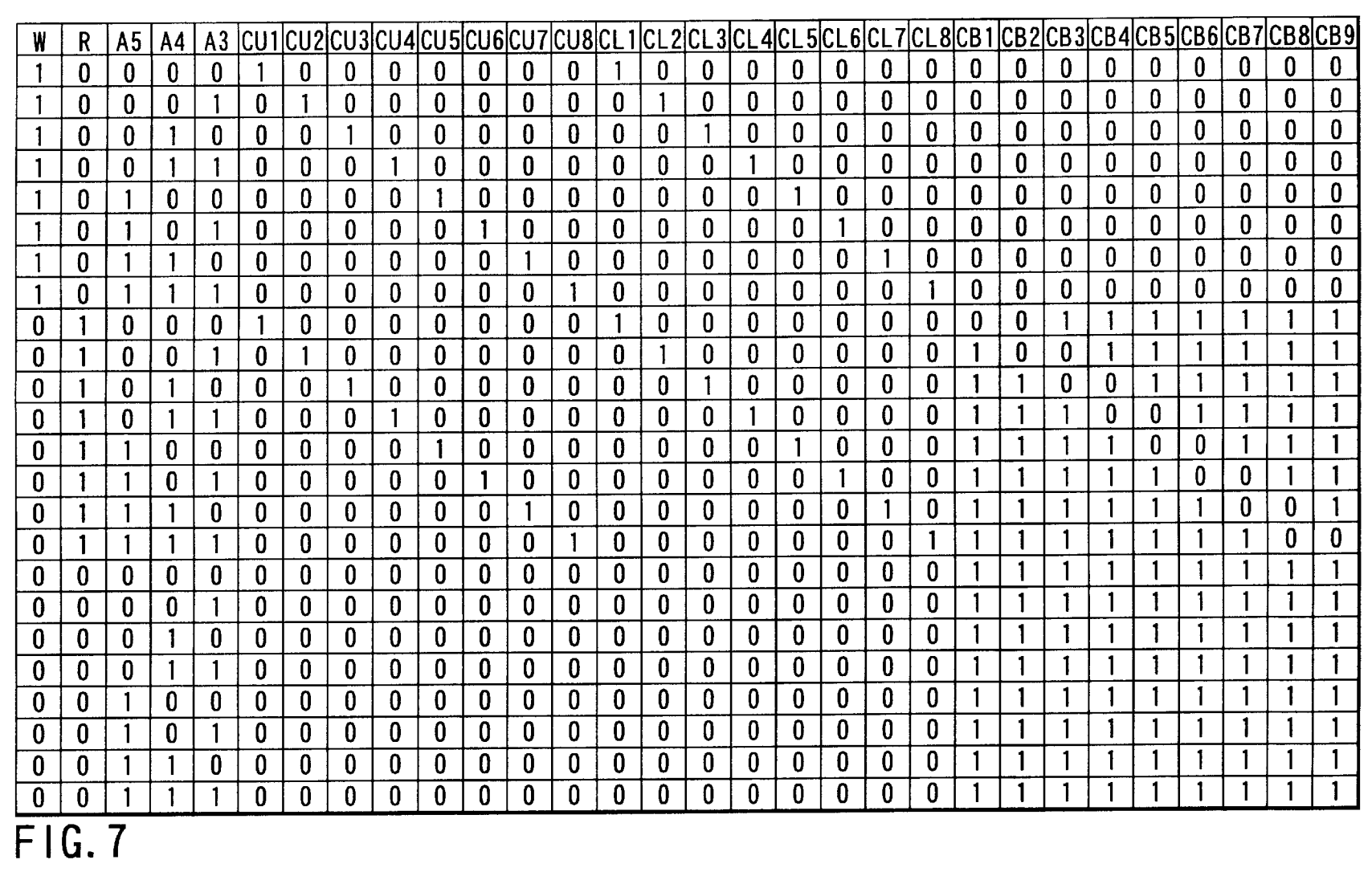

Logical levels of signals CU1–CU8, CL1–CL8 and CB1–CB9 are determined by address input signals A3, A4 and A5. Two examples of combinations of the logical levels of signals CU1–CU8, CL1–CL8 and CB1–CB9 are shown in FIGS. 6 and 7. In the example shown in FIG. 6, when signals W and R are both at a logic "0" (which indicates the erasing of data), signals CU1–CU8 and CL1–CL8 are all at a logic "0". Accordingly, transistors 1a–8a and 1c–8c, to which the signals are supplied, are turned off. On the other hand, signals CB1 to CB9 are all at a logic "1". In this case transistors 1b–9b, to which the signals are supplied, are turned on, so that bit lines BL1 to BL9 are connected to the bias circuit 107 and are therefore applied with a high voltage used for data erasing. At the time of data erasing, word lines WL1 to WL8 are all set at a logic "0" (e.g., at the ground potential). At the time of verify-reading (by which the erased state is checked), the power supply voltage V1 to be applied to the decoder 101 (which will be described later) is set at a predetermined level.

In the example shown in FIG. 6, once transistors 1a to 8a are turned on, they continue to be in the ON state. Transistors 1c to 8c are initially in the ON state and are turned off one by one. In the example shown in FIG. 7, in contrast, the transistors are turned on only when the need arises. This is the difference between the examples shown in FIGS. 6 and 7.

A description will be given with reference to FIGS. 5 and 6, as to how data programming is performed. To execute data programming, signals W and R are set at logical levels "1" and "0", respectively. In the first embodiment, programming takes place from the memory cells connected to bit line BL1 to the memory cells connected to bit line BL8. The memory cells to be programmed are designated by address inputs A3, A4 and A5. When A3=A4=A5="0", the memory cells between bit lines BL1 and BL2 are programmed. When A3="1" and A4=A5="0", the memory cells between bit lines BL2 and BL3 are programmed. In accordance with an increase in the address signal, the column of programmed memory cells moves. When A3=A4=A5="1", the memory cells between bit lines BL8 and BL9 are programmed.

When A3=A4=A5="0", signal CU1 is set at "1", signals CU2 to CU8 are set at "0", and signals CL1 to CL8 are set at "1". Hence, bit lines BL2 to BL9 are connected to the ground potential circuit 108 through transistors 1c to 8c whose gates receive signals CL1 to CL8 of level "1". Bit lines BL2 to BL9 are therefore set at the ground potential level. As shown in FIG. 5, bit line BL1 is connected to the data programming circuit 105 through two transistors, namely, transistor 1a whose gate receives signal CU1 of level "1", and transistor Tr2 which is connected to the transistor 1a and the gate of which receives signal W. Bit line BL1 is therefore applied with a high voltage by the data programming circuit 105. If the selected word line is set at a high voltage level, a current flows from bit line BL1 to bit line BL2 through the memory cell connected to that word line. Since charges are injected to the floating gate of the memory cell, data is programmed. If, on the other hand, the selected word line remains at the same reference potential level as non-selected word lines, no current flows through the selected memory cell. In this case, therefore, the floating gate continues to be in the erased state, and no data is programmed.

After data is programmed in the memory cells located between bit lines BL1 and BL2, address input A3 changes to a logic "1" and address inputs A4 and A5 are a logic "0", so that the memory cells between bit lines BL2 and BL3 are programmed. When A3="1" and A3=A4="0", signals CU1 and CU2 are set at "1", signals CU3 to CU8 are set at "0", signal CL1 is set at "0", and signals CL2 to CL8 are set at "1", as shown in FIG. 6. Accordingly, bit lines BL1 and BL2 are applied with a high voltage, and bit lines BL3 to BL9 are set at a ground potential level. If the selected word line is at the high voltage level, current flows through the memory cell which is arranged between bit lines BL2 and BL3 and the gate of which is applied with a high voltage, and the floating gate of these memory cell store charges. It should be noted that bit lines BL1 and BL2 are both applied with a high voltage. Therefore, even if the memory cells between these bit lines BL1 and BL2 are applied with a high voltage at their gates, no current flows through them, and the threshold values of them remain unchanged. In the example shown in FIG. 6, both bit lines BL1 and BL2 are applied with a high voltage. This, however, does not restrict the present invention. As shown in FIG. 7, signal CU1 may be set at "0", so as to electrically disconnect bit line BL1 from the data programming circuit 105.

In the manner described above, in the embodiment shown in FIG. 5, the bit line applied with a high voltage and the bit line applied with a reference potential are sequentially moved when the memory cells are programmed. After the end of the data programming, all word lines are set at a reference potential level, and in this state signals CU1 to CU8 are set at the "0" level and signals CL1 to CL8 are set at the "1" level. Accordingly, the bit lines are set at the ground potential level, thus releasing the bit lines from the applied voltage. At the time, bit line BL1 remains at the high voltage level. It is therefore preferable that a means for setting bit line BL1 at the ground potential level be provided.

A description will be given as to how data is read out from the memory cells programmed in the manner described above. To execute data reading, signals W and R are set at logical levels "0" and "1", respectively. When A3=A4=A5="0", one of the memory cells located between bit lines BL1 and BL2 is selected. As shown in FIG. 6, signal CU1 and signal CL1 are both set at logical level "1". Transistors 1a and 1c, which are supplied with signals CU1 and CL1, are therefore turned on. Accordingly, bit line BL1 is connected to sense amplifier 106 through two transistors, namely transistor 1a whose gate receives signal CL1, and transistor Tr1 which is supplied with signal R of logical level "1" and is in the ON state. Bit line BL2 is connected to the ground potential circuit 108 through transistor 1c whose gate receives signal CL1, and is therefore applied with the ground potential.

When word line WL1 is selected and set at logical level "1", memory cell 11 is selected. At the time, signals CB1 and CB2 are set at logical level "0" and signals CB3 to CB9 are set at logical level "1". Accordingly, non-selected bit lines BL3 to BL9 are connected to the bias circuit 107 through transistors 3b to 9b whose gates receive signals CB3 to CB9, respectively, and are therefore applied with the predetermined voltage. It should be noted that the non-selected bit lines need not be set at the predetermined voltage level; the transistors supplied with signals CB1 to CB9 are allowed to remain in the OFF state. When word line WL1 is selected, it is set at logical level "1" (e.g., 5V), with the other word lines being set at logical level "0". In this state, data is read out from memory cell 11.

When, in this state, address input A3 changes to logical level "1", signals CU1 and CL1 change to logical level "0" and signals CU2 and CL2 change to logical level "1". As a result, bit line BL2 is connected to the sense amplifier 106, and bit line BL3 is connected to the ground potential circuit 108. In addition, signal CB3 changes to logical level "0", and signal CB1 changes to logical level "1". Accordingly, bit line BL1 is applied with the predetermined potential by the bias circuit 107. Memory cell 21 is selected in this state.

If, in the state where memory cell 21 is selected, address inputs A3 and A4 change to logical levels "0" and "1", respectively, then memory cell 31 is selected. If, in the state where memory cell 31 is selected, address input A3 changes to logical level "1", then memory cell 41 is selected. If, in the state where memory cell 41 is selected, address inputs A3 and A4 change to logical level "0" and address input A5 changes to logical level "1", then memory cell 51 is selected. If, in the state where memory cell 51 is selected, word line WL1 changes to logical level "0" and word line WL2 changes to logical level "1", then word line WL2 is selected. In this case, therefore, memory cell 52 is in the selected state.

A more detailed description will be given of the case where memory cell 11 is selected. In this case, bit line BL2 is applied with the ground potential, as described above. To be more specific, one end of the memory cell 11 which is connected to bit line BL2 is connected to the ground potential. Bit line BL1, to which the other end of memory cell 11 is connected, is connected to the sense amplifier 106. The memory cell stores either logical data "0" or logical data "1", depending upon its threshold voltage. That is, the memory cell has a high threshold voltage when its floating gate stores charges at the time of data programming, and has a low threshold voltage when its floating does not store charges (i.e., is in the erased state) at the time of data programming. If the threshold voltage of the selected memory cell which is connected to the word line of a logical level "1" is high, the memory cell is not turned on. If the selected memory cell has a low threshold voltage, the memory cell is turned on.

Of the memory cells arranged between bit lines BL1 and BL2, those connected to word lines WL2 to WL8 are in the OFF state since the word lines WL2 to WL8 are at logical level "0" and are therefore in the non-selected state. When memory cell 11 has a high threshold voltage, it is in the OFF state even if word line WL1 is at logical level "1". Bit line BL1 is charged by a load transistor of the sense amplifier 106, and the charged state is sensed by the sense amplifier 106. For example, the data stored in the memory cell 11 is determined as logical data "1". On the other hand, when memory cell 11 has a low threshold voltage, it is turned on. As a result, charges flow from bit line BL1 to the ground potential through the memory cell 11 and bit line BL2. The discharged state of bit line BL1 is sensed by the sense amplifier 106. For example, the data stored in the memory cell 11 is determined as logical data "0". To select memory cell 21, bit line BL2 is connected to the sense amplifier 106, and bit line BL3 is connected to the ground potential circuit 108. When memory cell 21 has a high threshold voltage, bit line BL2 is electrically disconnected from bit line BL3. Therefore, bit line BL2 is charged by the load transistor of the sense amplifier 106, and this charged state is sensed by the sense amplifier 106. When memory cell 21 has a low threshold voltage, charges flow from bit line BL2 to the ground potential circuit 108 through memory cell 21 and bit line BL3. This discharged state is sensed by the sense amplifier 106.

In the nonvolatile semiconductor memory device of the above configuration, a memory cell from which data is not read out is turned on, if it has a low threshold voltage and is connected to the selected word line of a logic "1". For example, if the memory cell 41 is selected and this memory cell has a high threshold voltage, it is turned off. However, if the memory cell 31 adjacent to the memory cell 41 has a low threshold voltage, then the memory cell 31 will be turned on. Let it be assumed that memory cell 31 shown in FIG. 5 and all memory cells 21 and 11 that are connected to word line WL1 arranged on the right side of the memory cell 31 have low threshold voltages. In this case, bit line BL4 and all bit lines BL3–BL1 arranged on the right side thereof are connected together through the memory cells 31, 21, and 11 having low threshold voltages. If the bit lines BL4–BL1 are at the ground potential level, the load transistor of the sense amplifier 106 charges not only bit line BL4 but also all bit lines BL3–BL1 that are arranged on the right side of bit line BL4. Since data cannot be read out from memory cell 41 before the bit lines are all charged, the data read time will be undesirably long. In order to prevent this problem, the bit lines that are not selected are charged and set at a predetermined potential level by the bias circuit 107, as described above. Needless to say, however, the non-selected bit lines need not be set at the predetermined potential level by the bias circuit 107 if data do not have to be read out at high speed.

Although data can be programmed in any arbitrary memory cell, it is desirable that the data programming be started first for an end column of the memory cell array and that the column of the programmed memory cells move inward from that end column. The reason for this will be described. Let it be assumed that programming is started from memory cell 41 and that bit lines BL4 and BL5 are applied with a high voltage and a reference potential, respectively. Charges can be injected into the floating gate by applying a high voltage to word line WL1 at the time. Since word line WL1 is at the high potential level, non-selected memory cells 31, 21 and 11 are in the conductive state. This being so, even if bit lines BL3, BL2 and BL1 are set in the electrically floating state, current from bit line BL4 flows into them through memory cells 31, 21 and 11, in an amount that charges the capacitances of bit lines BL3, BL2 and BL1. Due to this current, it may happen that charges are erroneously injected into the floating gates of memory cells 31, 21 and 11.

This problem can be solved if current is prevented from flowing through non-selected memory cells 31, 21 and 11, by applying a high voltage to bit lines BL3, BL2 and BL1 as well as to bit line BL4. In order to program data in a memory cell of an arbitrary address, however, the large amount of charges stored in non-elected bit lines have to be discharged. For example, in the case where data is programmed in memory cell 11 after it is programmed in memory cell 41, bit line BL2 has to be set at the reference potential. If this is done, the bit lines BL4, BL3 and BL2 are discharged, and the charges stored therein are wasted. If bit lines BL1 and BL2 are sequentially applied with a high voltage, it is not necessary to discharge the bit lines, and good use can be made of the charges stored in the bit lines. In addition, since the time for discharging is not required, a high-speed operation is realized. For this reason, data programming is sequentially executed from an end column in the embodiment of the present invention. If the operation is not restricted in time or a waste of charges is not a problem, it is possible to execute data programming at random.

In the first embodiment shown in FIG. 51 transistors 1a–8a and 1c–8c are arranged at the same side of the memory cell array. However, it is possible to arrange transistors 1a–8a and transistors 1c–8c are arranged at the opposite sides of the memory cell array. In the latter case, it can be expected that the uniform programming characteristic is obtained since the sum of the resistance between the programming circuit 105 and the drain of the memory cell and the resistance between the ground potential circuit 108 and the source of the memory cell can be set uniform for all memory cells.

Figure 8:
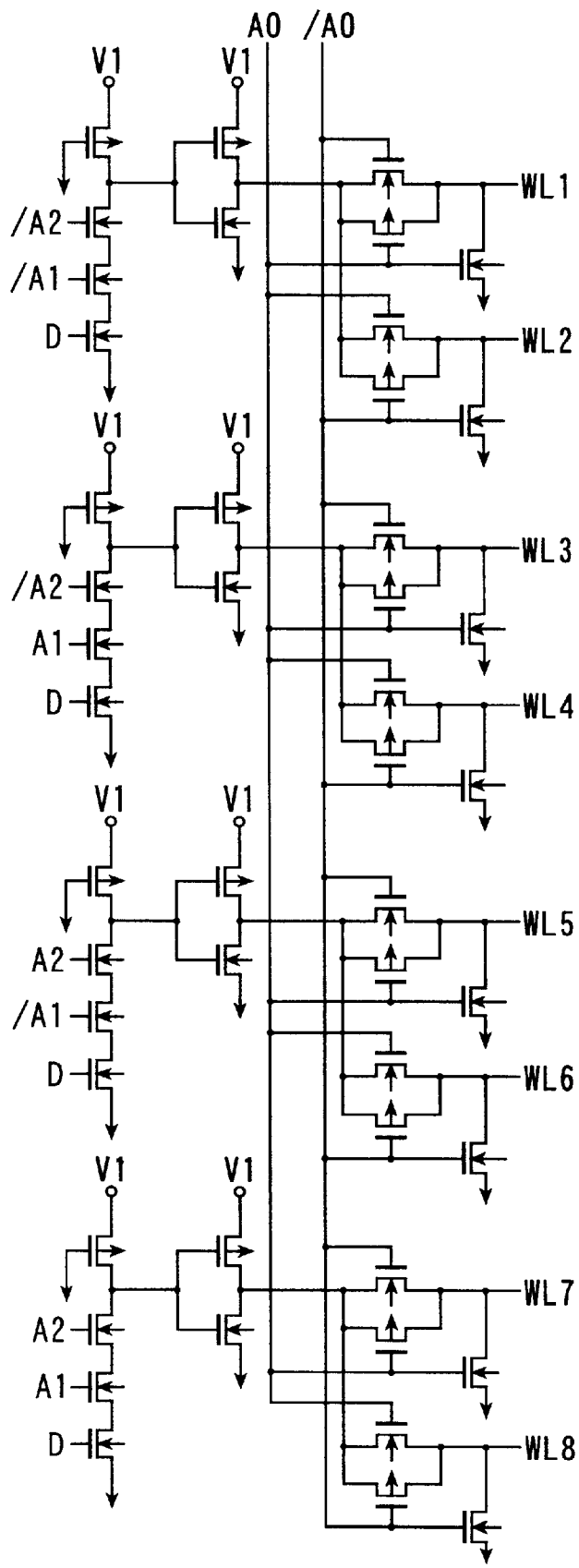
FIG. 8 is a circuit diagram of an example of a row decoder which can be employed in the first embodiment.
Figures 9A, 9B, 10A, 10B:
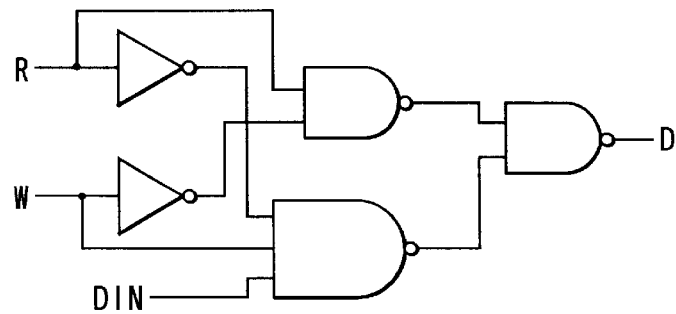
FIGS. 9A and 9B show truth tables pertaining to signals output from the row decoder depicted in FIG. 8.
FIG. 10A shows a circuit for generating signal D used in the row decoder depicted in FIG. 8.
FIG. 10B shows a truth table pertaining to signal

FIG. 8 shows an example of a row decoder applicable to the present invention. The row decoder is designed to select eight word lines based on address inputs A0, A1 and A2. FIG. 9A is a truth table showing how the address inputs and selected word lines are associated with each other when the data to be programmed in a memory cell is of logical level "1". When data is of logical level "1", charges are injected into the floating gate of a memory cell, so as to set a high threshold voltage for the memory cell. FIG. 9B is a truth table showing how the address inputs and selected word lines are associated with each other when the data to be programmed in a memory cell is of logical level "0". Signal D is produced by the circuit shown in FIG. 10A, and the relationships among signals W, R and DIN and signal D are shown in FIG. 10B. Assuming that "/" denotes an inverted state of a signal, "×" denotes a logical product, and "+" denotes a logical sum, signal D can be expressed by the following formula:

$$D = R \times /W + /R \times DIN \times W$$

In FIG. 10A, DIN is data to be written in a memory cell. When both signals W and R are of logical level "0", the row decoder is in the erasing mode, and data D is of logical level "0". In this case, all word lines that are depicted in FIG. 8 are applied with a reference potential. When signal W is of logical level "1" and signal R is of logical level "0", the row decoder is in the programming mode, and data D is of the same logical level as data DIN. In this case, data D is input in accordance with the logical level of data DIN in the circuit shown in FIG. 8. When data DIN to be written is of logical level "1", the single word line selected based on address inputs A0 to A3 is applied with a high potential. When signal W is of logical level "0" and signal R is of logical level. "1", the row decoder is in the reading mode, and data D is of logical level "1". In this case, when data D is of logical level "1", one of the word lines selected based on address inputs A0 to A3 is set in the logical level "1", and a power supply voltage V1 is applied thereto.

Figure 11A:
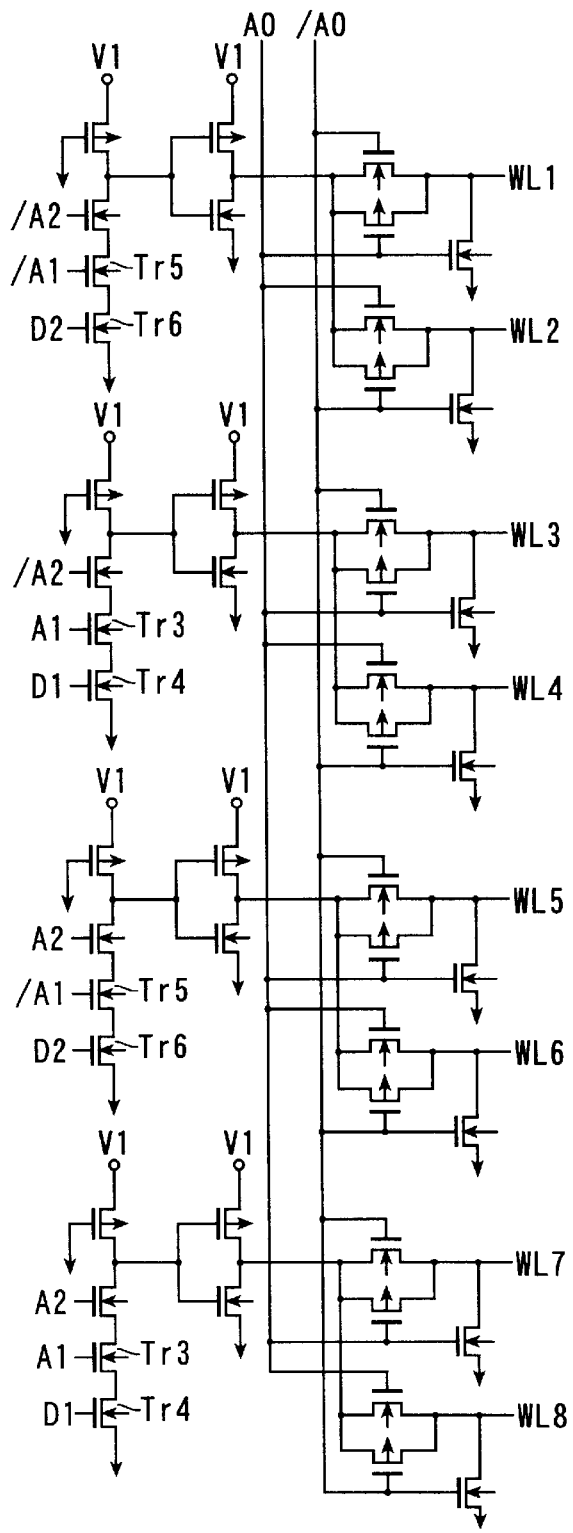
FIGS. 11A and 11B are circuit diagrams of another example of a row decoder which can be employed in the first embodiment.
Figure 11B:
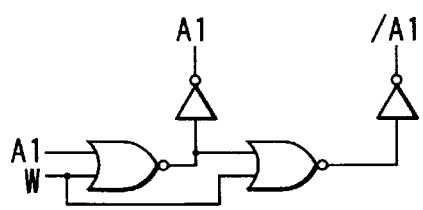

The row decoder described above with reference to FIGS. 8–10B is design to program the memory cell connected to the word line at one time. However, the row decoder may be modified in such a manner as to program the memory cells connected to two word lines at one time. The row decoder modified in this manner is shown in FIG. 11A. FIG. 11B shows a circuit which receives control signal W and address A1 and outputs an internal address signal A1 and an inverted internal address signal /A1. The internal address signal A1 and the inverted internal address signal /A1 are applied to the row decoder shown in FIG. 11A. D1 and D2 shown in FIG. 11A are obtainable from the circuit shown in FIG. 12A, and the relationships between signals W, R and DINi (i=1, 2) and signal Di are indicated in the truth table shown in FIG. 12B. Signal Di is repressed by the following formula:

$$Di = R \times /W + /R \times DINi \times W$$

Referring to FIG. 11A, signal D1 is supplied to transistor Tr4, which is connected to transistor Tr3 supplied with the address input A1. Signal D2 is supplied to transistor Tr6, which is connected to transistor Tr5 supplied with the address input /A1. In this manner, different data are supplied to the decoders that receive the address inputs A1 and /A1. Signal D1 is data which is written when the address input A1 is of logical level "1", while signal D2 is data which is written when the address input A1 is of logical level "0". When both address inputs A1 and /A1 are of logical level "1" in the programming mode, the corresponding two word lines selected by the address input A2 are selected at a time, and two different data based on signals D1 and D2 can be simultaneously programmed in the memory cells connected to the two word lines. In this case, two kinds of data, namely the data which should be written when the address input A1 is of logical level "1" and the data which should be written when the address input A1 is of logical level "0", can be stored in latch circuits, for example.

Figures 12A, 12B:
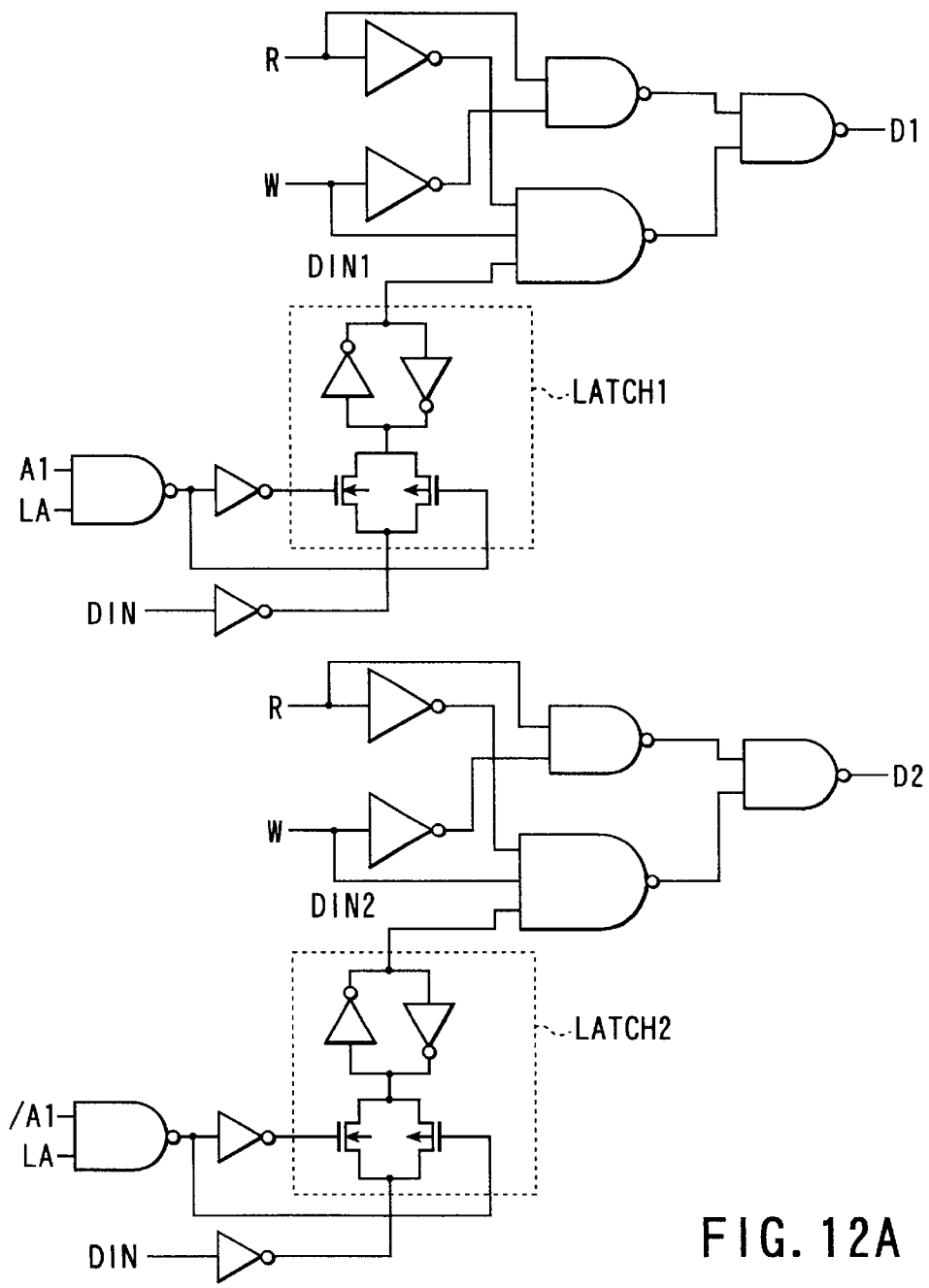
FIG. 12A shows a circuit for generating signals D1 and D2 used in the row decoder depicted in FIGS. 11A and 11B.
FIG. 12B shows a truth table pertaining to signals D1 and D2.

Referring to FIG. 12A, externally-supplied write data DIN is latched in latch circuit LATCH1 when both address signal A1 and latch signal LA are of logical level "1". In this case, signal D1 is output. The write data DIN is latched in latch circuit LATCH2 when address signal A1 is of logical level "0" and latch signal LA is of logical level "1". In this case, signal D2 is output.

Figure 13:
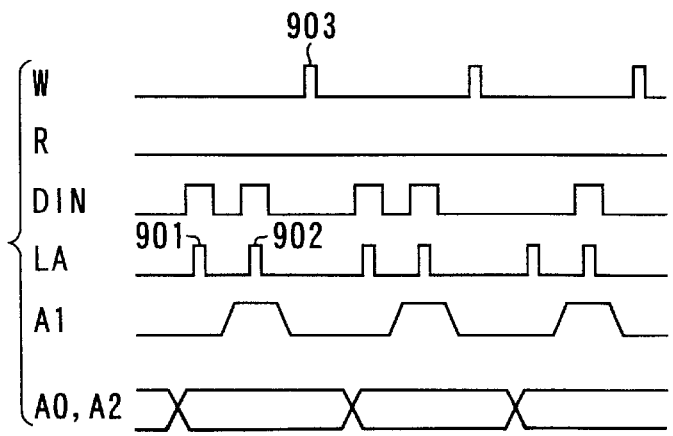
FIG. 13 shows waveforms of signals used when programming is performed according to the first embodiment.

FIG. 13 shows waveforms of some signals appearing in the circuits shown in FIGS. 11A and 12A. Referring to FIG. 13, the write data DIN to be written when address signal A1 is set at logical level "0" is latched in latch circuit LATCH2 based on latch signal 901, while the write data DIN to be written when address signal A1 is set at logical level "1" is latched in latch circuit LATCH1 based on latch signal 902. Thereafter, write signal W 903 is set at logical level "1", and data writing is executed. In the row decoder shown in FIG. 11A, write data D1 is supplied to the decoder section which receives address signal A1, while write data D2 is supplied to the decoder section which receives inverted address signal /A1. As shown in FIG. 11B, in the circuit for supplying address signals A1 and /A1 to the row decoder, both address signals A1 and /A1 are set at logical level "1" when write signal W is of logical level "1", with the result that two word lines are selected at a time. On the other hand, when write signal W is of logical level "0", the internal address signals A1 and /A1 are output in response to input signal A1. In the first embodiment, two pieces of data are written in association with address signal A1, as shown in FIG. 11B. Needless to say, however, address signal A0 and data D may be subjected to a logical operation, and data may be written in association with address signal A0. That is, the system can use any address signal, and the selection of an address signal can be determined in such a manner as to be optimal to the system.

Figure 14:
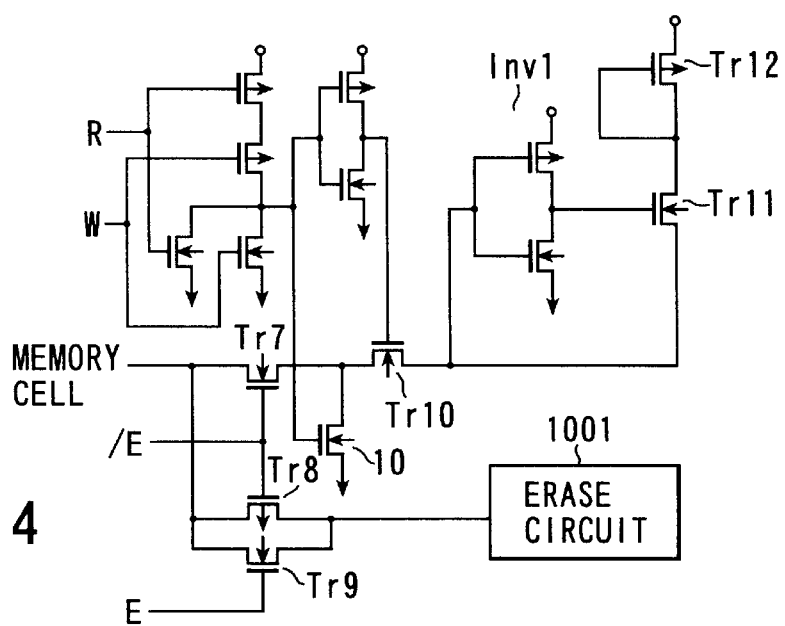
FIG. 14 is a circuit diagram of a bias circuit employed in the first embodiment.

FIG. 14 shows an example of the bias circuit 107 depicted in FIG. 5. The bias circuit 107 has a similar circuit configuration to that of the sense amplifier 106 to be described later. The voltage which the bias circuit 107 applies to a non-selected bit line to bias the same at the time of data reading is at the same level as the voltage which the sense amplifier applies to a selected bit line. This means that the bit line to be selected next is set at the predetermined voltage level beforehand, thus shortening the time required to charge bit lines. When both signals R and W are of logical level "0" (i.e., in the data erasing mode), signal E and its inverted signal /E are set at logical levels "1" and "0", respectively. Since transistor Tr7 is turned off, and transistors Tr8 and Tr9 are turned on, an erase circuit 1001 is connected to the memory cells through transistors Tr8 and Tr9, and a high voltage is applied to the bit line.

As shown in FIG. 6, when both signals R and W are at logical level "0", signals CB1 to CB9 are at logical level "1". Accordingly, a high voltage is applied to all bit lines by the erase circuit 1001. When data is programmed, signal W is set at logical level "1", signals R and E at logical level "0", and signal /E is at logical level "1". Consequently, transistors Tr8 and Tr9 are turned off, and the erase circuit 1001 is disconnected from the memory cells. Transistor Tr7 is turned on, and transistor Tr10 is also turned on since signal W is at logical level "1". Accordingly, the predetermined potential, which is determined by inverter Inv1 and transistors Tr11 and Tr12, is output through transistors Tr10 and Tr7.

When signal W is at logical level "1" and signal R is at logical level "0" (i.e., in the mode for data programming), signals CB1 to CB9 are at logical level "0", as shown in the truth table in FIG. 6. Since transistors 1b–9b, to which signals CB1 to CB9 are supplied, are turned off, the memory cells are disconnected from the bias circuit 107. In this case, transistor Tr7 may be controlled in the OFF state.

When data is read out from the memory cells, signal W is at logical level "0", and signal R is at logical level "1". A predetermined potential is output through transistors Tr7 and Tr10 and is applied to a non-selected bit line. Each of the inverter Inv1, and transistors Tr11 and Tr12 has a similar circuit configuration to that of the sense amplifier shown in FIG. 15.

Figure 15:
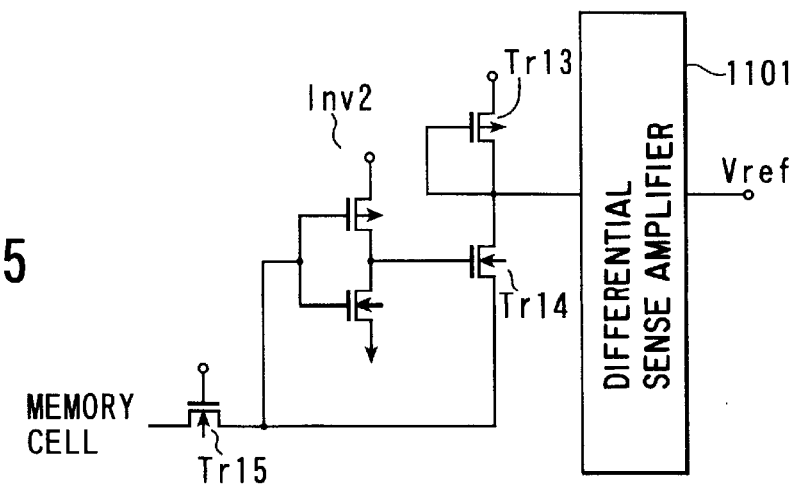
FIG. 15 is a circuit diagram of a sense amplifier employed in the first embodiment.

FIG. 15 shows an example of the sense amplifier 106 depicted in FIG. 5. Of the circuit elements of the sense amplifier 106, a P-channel transistor Tr13 serves as a load transistor. Inverter Inv2 and transistors Tr13 and Tr14 jointly constitute a well-known feedback type bias circuit. A differential sense amplifier 1101 senses whether the bit line is in the charged state or discharged state by comparing a potential appearing at a connection node between transistors Tr13 and Tr14 with a reference potential Vref, and then the storage data in the memory cell is read. It should be noted that the reference potential Vref is not a ground potential. The reference potential Vref is set between the potential at the time of the charged state of the connection node between transistors Tr13 and Tr14 and the potential at the time of the discharged state of the connection node between transistors Tr13 and Tr14.

Figure 16:
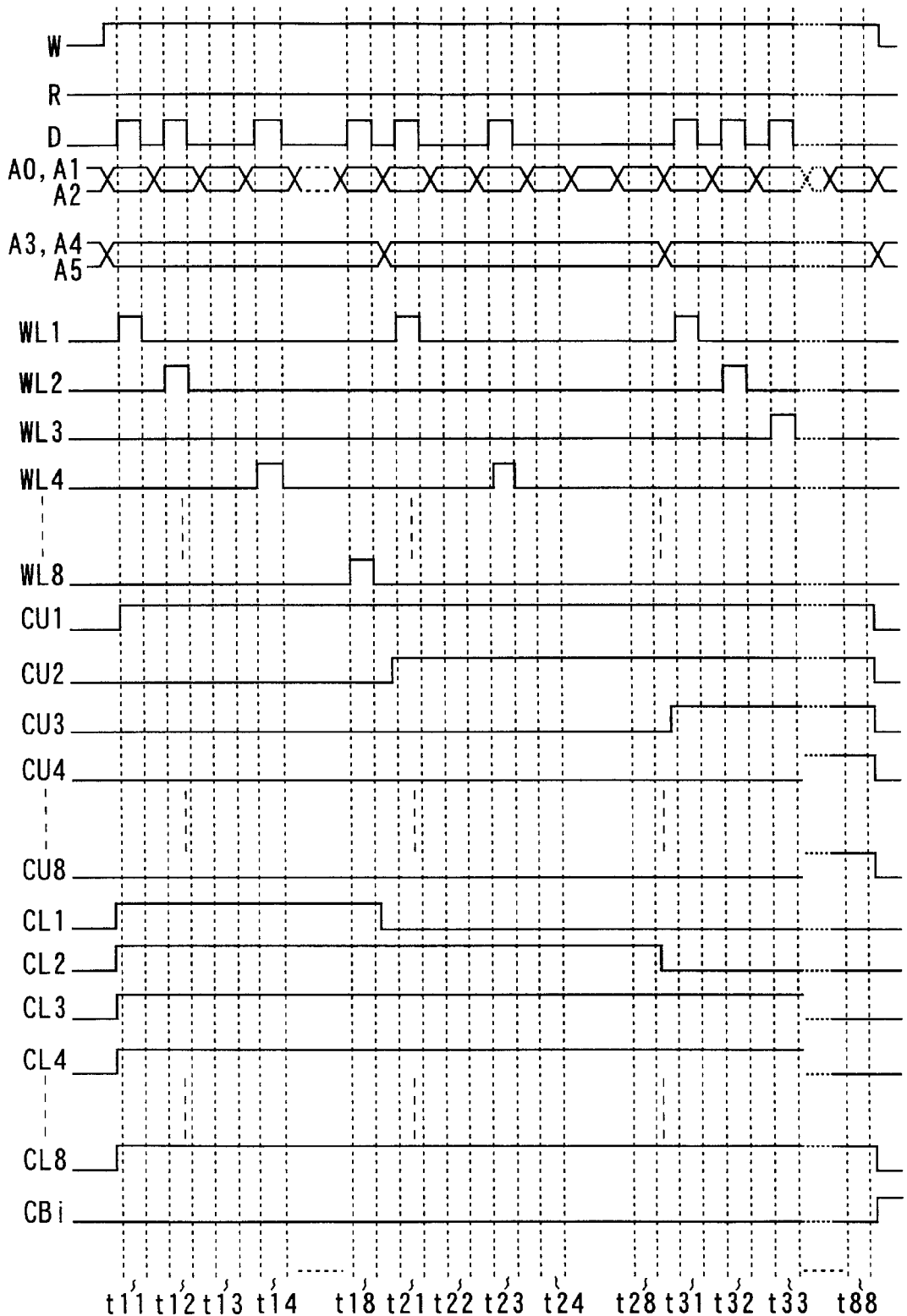
FIG. 16 is a waveform chart illustrating how programming takes place according to the first embodiment.

FIG. 16 shows waveforms of signals used when data programming is performed in the first embodiment (i.e., when data programming is executed in units of one row). The waveform chart in FIG. 16 is based on signals CU1–CU8 and CL1–CL8 shown in FIG. 6. When data is written, signal W is set at logical level "1". Whether data is actually written or not is determined by input data D. When this signal D is "1", the corresponding word line is set at "1". Signal D takes the value of "1" after address inputs A0, A1 and A2 used for designating a row are determined, and after signal D takes the value "0", address inputs A0, A1 and A2 are varied. The reason for this relationship is to prevent data from being written by mistake. Since signal D is "1" during time t11, word line WL1 is set at "1". Since signal D is "0" during time t13, for example, word line WL3 remains at "0", and no data is written. Since, in this example, data writing is executed first with respect to the memory cells connected to bit line BL1, signal CU1 is set at "1" first of all. After time t21 during which the values of address inputs A3, A4 and A5 used for designating a column are changed, data writing is executed with respect to the memory cells of the next column. When signal W is "0" at the end of the writing operation for the memory cells, signals CB1 to CB9 change to a logic "1". Transistors Tr7 and 10 are turned on by controlling the bias circuit 107 in such a manner as to set signals W and R to be "0" and signal /E to be "1" for a predetermined length of time. Through these transistors Tr7 and 10, the bit lines are discharged to the ground potential.

It is desirable that the bit line is gradually discharged when the programming is ended. Since the bit line is formed on the semiconductor substrate, capacitive coupling exists between the bit line and the substrate. When the high voltage at the bit line is discharged, the potential of that portion of the substrate adjacent to the bit line is lowered to a negative level by the capacitive coupling between the bit line and the semiconductor substrate. The substrate is usually set to the ground potential so that there is a possibility in which the device is erroneously operated if the potential of the substrate is negative. In order to prevent the potential of the substrate from being lowered to a negative level, the bit line is preferably discharged slowly.

Figure 17:
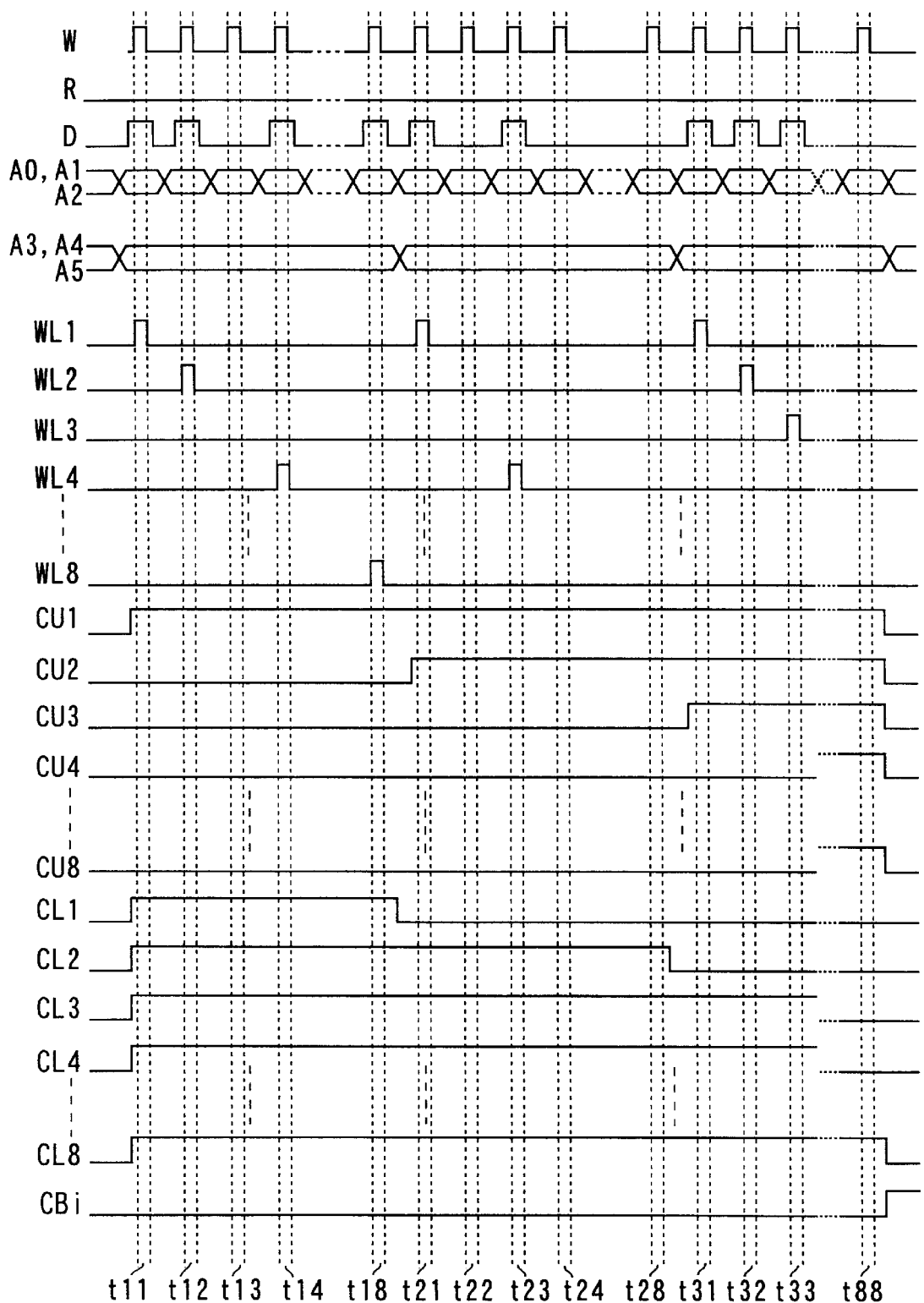
FIG. 17 is another waveform chart illustrating how programming takes place according to the first embodiment.

FIG. 17 is a modification of the programming method of the first embodiment. In the method shown in FIG. 16, signal W is at logical level "1" at all times when data is programmed in the memory cells. The modification shown in FIG. 17 differs from this method in that signal W is input as a pulse signal, and pulse signal W is set at "1" for data writing during a time period when the value of signal D is fixed.

Figure 18:
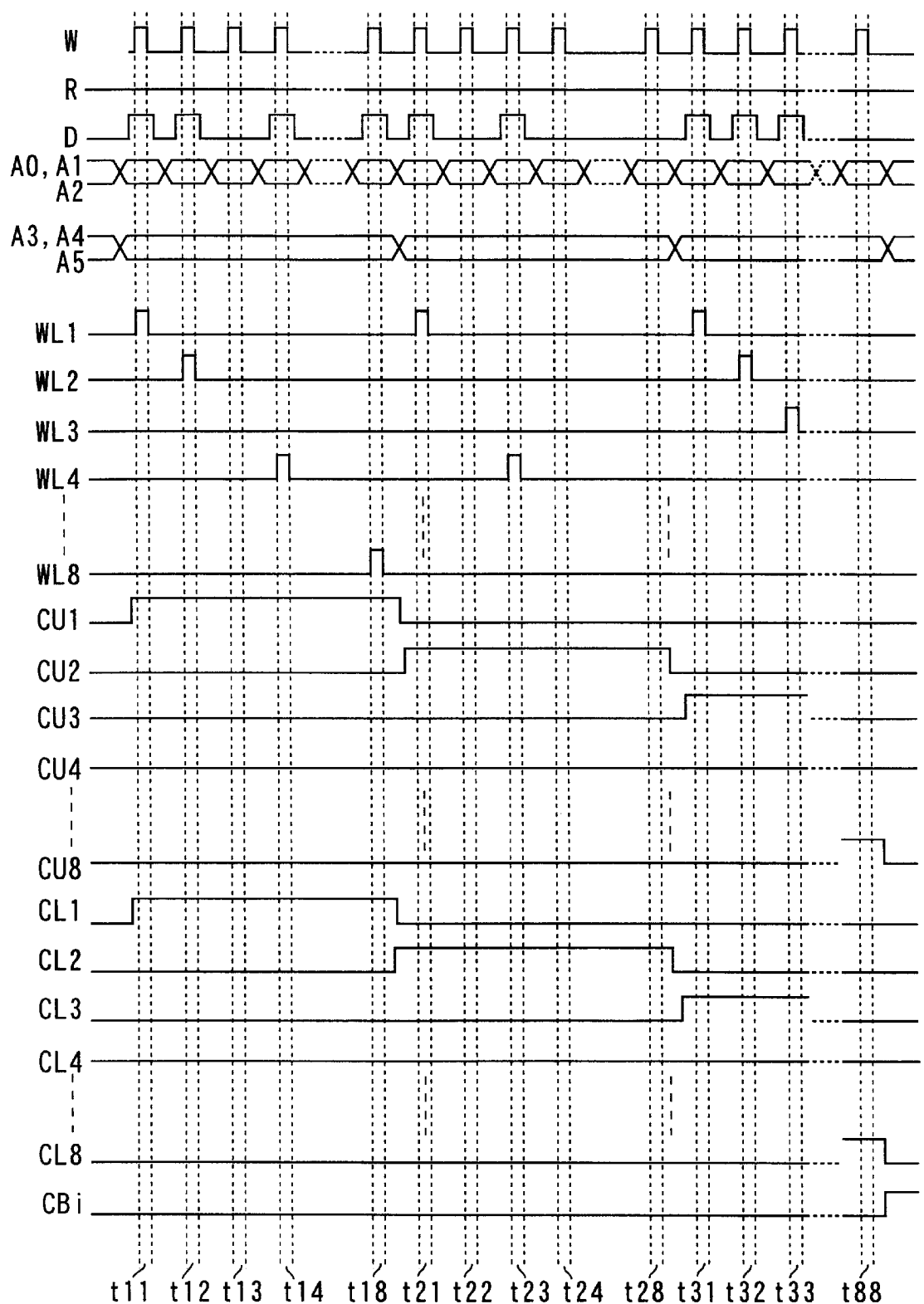
FIG. 18 is still another waveform chart illustrating how programming takes place according to the first embodiment.

FIG. 18 is another modification of the programming method of the first embodiment. In the method shown in FIG. 16, signals CU1 to CU8 and signals CL1 to CL8 are based on the truth table shown in PIG. 6. The modification shown in FIG. 18 differs from this method in that those signals are based on the truth table shown in FIG. 7. According to the modification shown in FIG. 18, each of signals CU1 to CU8 and each of signals CL1 to CL8 change back to level "0" at the end of a data writing with respect to the memory cells of one column. Accordingly, since the bit lines which have been used for data writing are set in the electrically floating state, the time during which the bit lines are applied with a high voltage is short, which is desirable in light of the reliability of the device.

As described above, in the virtual grounded type EEPROM according to the first embodiment, data is programmed in the memory cell array by controlling the voltage of the control gates of the memory cells while maintaining a high potential state of the drains of the memory cells. By controlling the ON/OFF state of the memory cell in this manner, the floating gates are selectively permitted to store charges, for data programming. Since offset transistors can be eliminated from the EEPROM of the first embodiment, the occupation area of the memory cell array can be as small as possible, and the manufacturing yield can be improved. In the EEPROM of the first embodiment, moreover, the data programming of the memory cell array is executed first with respect to the bit line at one end of the memory cell array, and is sequentially continued thereafter. Due to this feature, when the bit line adjacent to the programming-completed bit line is programmed, the drains need not be released from the charges stored therein. Even if the drains are kept applied with a high voltage, data is prevented from mistakenly written in the memory cells connected to the programming-completed bit line. Hence, the time required for data writing is not long in spite of the omission of offset transistors.

Other embodiments of the nonvolatile semiconductor memory device according to the present invention will be described. The same portions as those of the first embodiment will be indicated in the same reference numerals and their detailed description will be omitted.

(Second Embodiment)

If the number of memory cells is increased in the device shown in FIG. 5, it is possible to obtain a nonvolatile semiconductor memory device having an arbitrary storage capacity. However, if the number of memory cells connected to one bit line is increased, the parasitic capacitance of the bit line will increase, adversely affecting the data reading speed and the data programming speed.

Figure 19:
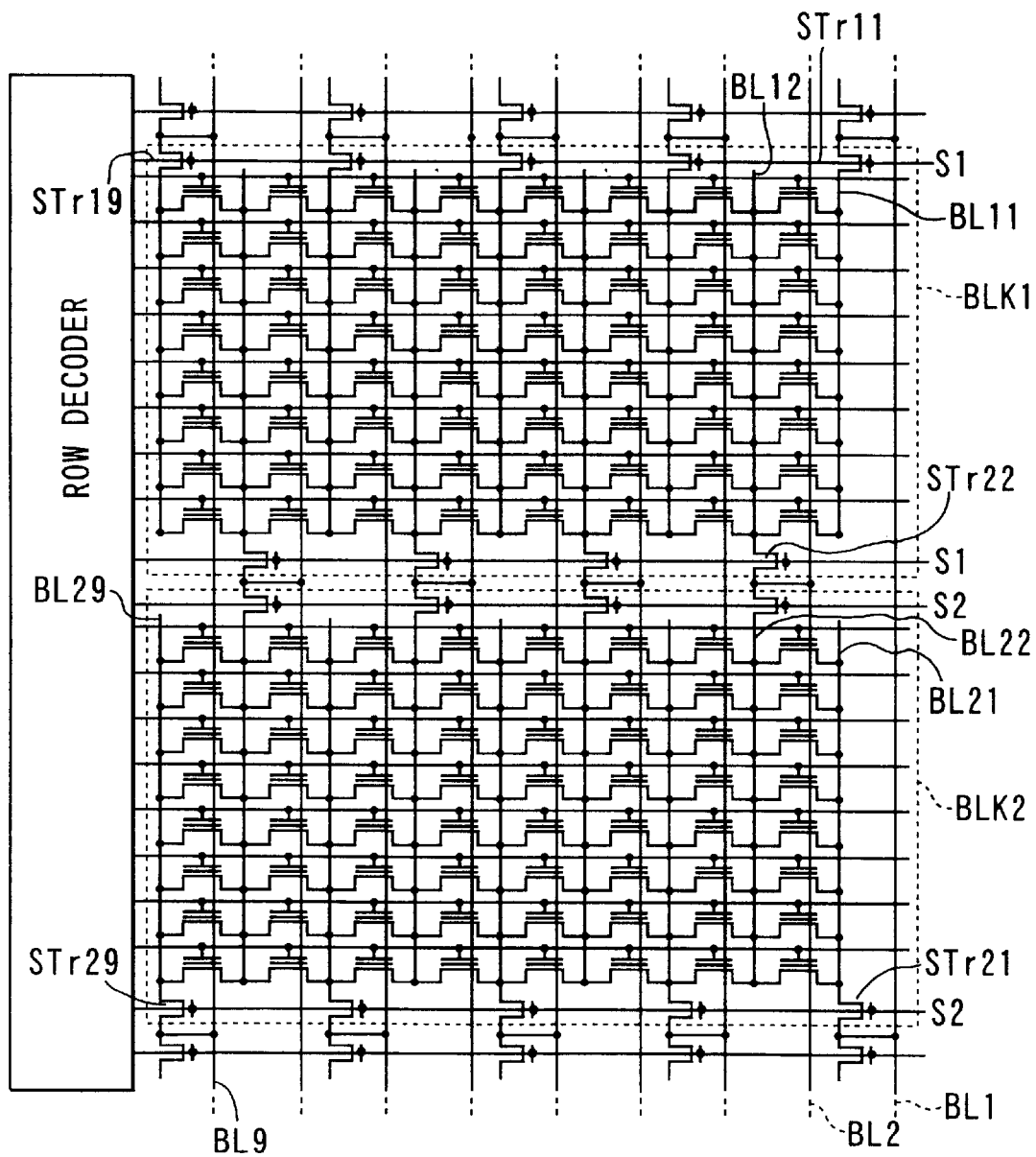
FIG. 19 is a circuit diagram showing a nonvolatile semiconductor memory device according to the second embodiment of the present invention.

FIG. 19 shows the second embodiment of the present invention, which has been conceived to solve the problems.

According to the second embodiment, the memory cell array is divided into a plurality of memory blocks BLK1, BLK2, . . . , BLKi. The bit lines (hereinafter referred to as first bit lines) BL11–BL19, BL21–BL29, . . . , BLi1–BLi9 within each memory block are connected to common bit lines (hereinafter referred to as second bit lines) BL1–BL9 through selection transistors STr11–STr19, STr21–STr29, . . . , STri1–STri19. The gates of the selection transistors STr11–STr19, STr21–STr29, . . . , STri1–STri9 are supplied with signals S1, S2, . . . , Si, respectively. The second bit lines BL1 to BL9 are connected to a program circuit through a column selection circuit, which is controlled by a column decoder (not shown).

In the circuit configuration described above, the first bit lines of the memory blocks selected in response to signals S1, S2, . . . , Si are connected to the respective second bit lines, for data programming or erasing. Like the row decoder of the first embodiment, the row decoder of the second embodiment can employ such a circuit configuration as is shown in FIG. 11A, and data can be written in a plurality of memory cells at a time. For example, data can be simultaneously programmed for all memory blocks by providing signal lines through which write data DIN is entered in response to signals S1, S2, S3, . . . and by controlling signals S1, S2, S3, . . . to be at logical level "1". Needless to say, this programming method is applicable not only to the case where all memory blocks are programmed at a time but also to the case where two or an arbitrary number of blocks are programmed at a time.

(Third Embodiment)

Figure 20:
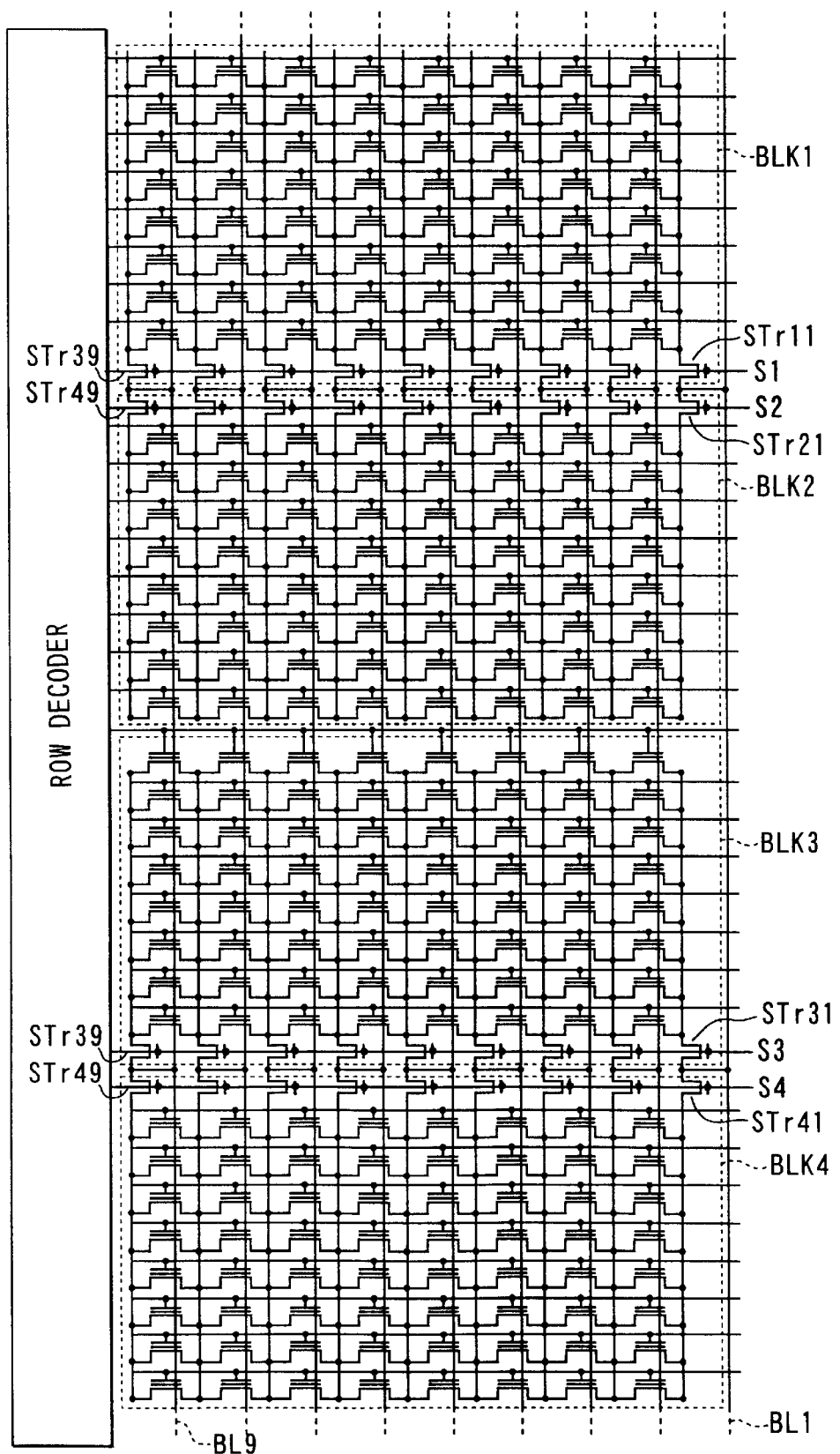
FIG. 20 is a circuit diagram showing a nonvolatile semiconductor memory device according to the third embodiment of the present invention.

FIG. 20 shows the third embodiment, which is a modification of the second embodiment. In the second embodiment shown in FIG. 19, the selection transistors STr11–STr19, STr21–STr29, . . . , STri1–STri9 of each memory block are arranged such that the selection transistors of the adjacent columns are at the opposite ends of the memory block. To be more specific, the selection transistors arranged in the odd-numbered columns are positioned at one end of the memory block, while those arranged in the even-numbered columns are positioned at the other end. This arrangement is not adopted in the third embodiment. In the third embodiment, the selection transistors STr11–STr19, STr21–STr29, . . . , STri1–STri9 of each memory block are arranged at one end of the memory block, as shown in FIG. 20.

Where the selection transistors are arranged in such a manner as in the third embodiment, each memory block requires only one signal line, for selection. In other words, the number of memory blocks BLK1, BLK2, . . . , BLKi is equal to the number of signal lines for memory block selection. Accordingly, the area required for the memory cell array can be reduced.

(Fourth Embodiment)

Figure 21:
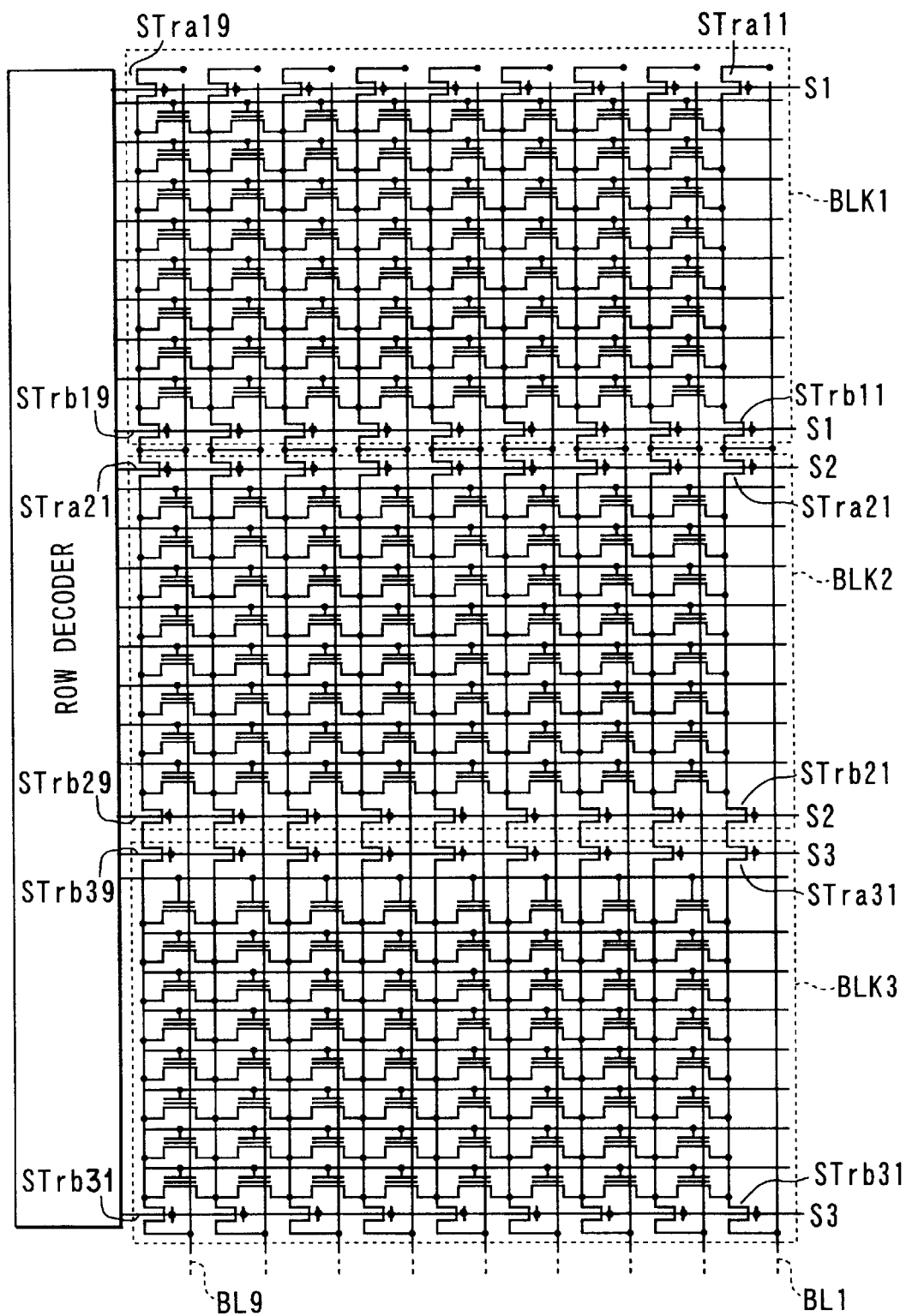
FIG. 21 is a circuit diagram showing a nonvolatile semiconductor memory device according to the fourth embodiment of the present invention.

FIG. 21 shows the fourth embodiment, which is another modification of the second embodiment. In the second embodiment shown in FIG. 19, the selection transistors of each memory block are arranged such that one selection transistor is provided for each column and the selection transistors of the adjacent columns are positioned at the opposite ends of the memory block. The fourth embodiment shown in FIG. 21 differs from the second embodiment in that a selection transistor is provided at both ends of each column such that a memory block has selection transistors at both ends. As shown in FIG. 21, each of first bit lines BL11–BL19, BL21–BL29, . . . , BLi1–BLi9 has selection transistors STra11–STra19, STra21–STra29, . . . STra11–STra19 and STrb11–STrb19, STrb21–STrb29, STrbi1–Strbi9 at the respective ends. Through these selection transistors, the first bit lines BL1 to BL9 are connected to the second bit lines.

The structure of the fourth embodiment is advantageous in that the bit lines of each memory block can be charged or discharged at both ends. Accordingly, the resistance of the bit lines can be reduced, and the data reading speed and the data programming speed can be further shortened.

(Fifth Embodiment)

The fifth embodiment concerns an improved memory cell structure applicable to the first to fourth embodiments.

Figure 22A:
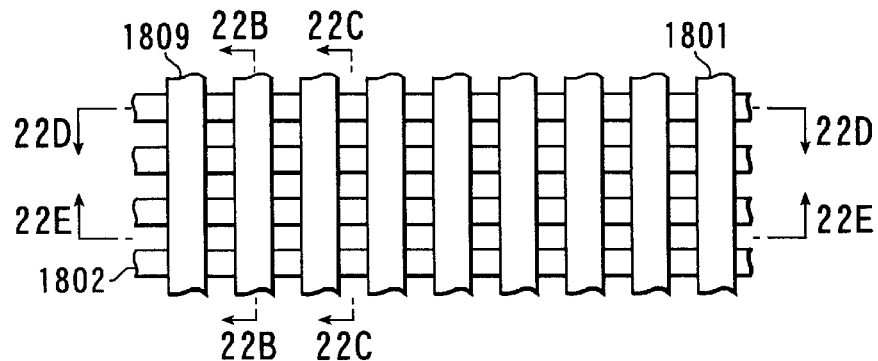
FIGS. 22A, 22B, 22C, 22D and 22E show an optimal memory cell applicable to the present invention.
Figure 22B:
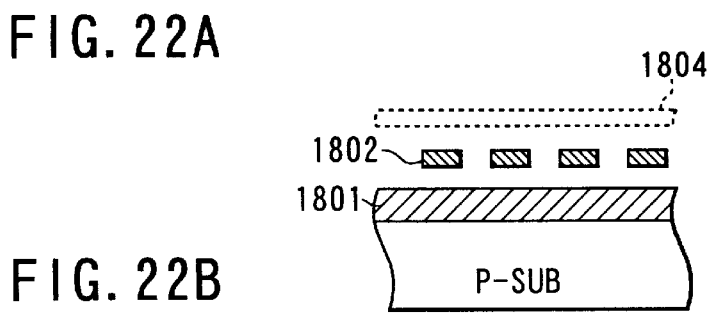
Figure 22C:
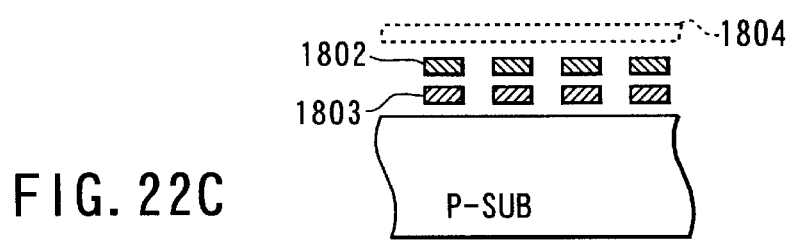
Figure 22D:
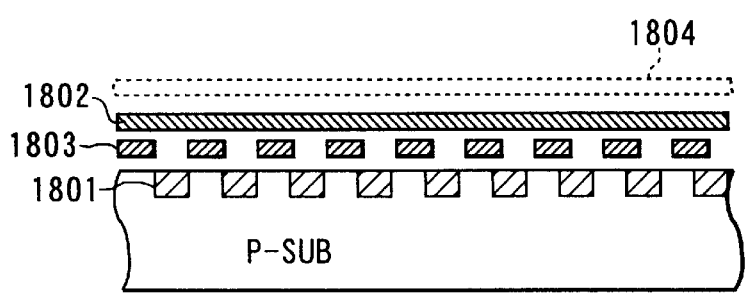
Figure 22E:
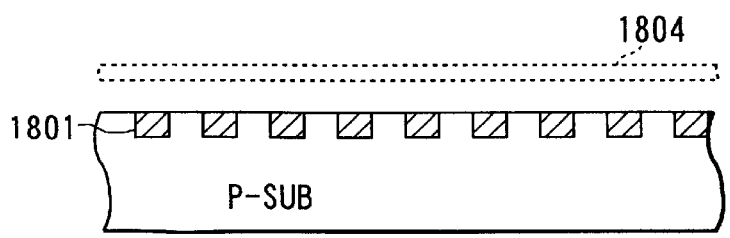

FIG. 22A is a plan view showing memory cells employed in the foregoing embodiments. $N^+$ layers 1801 to 1809 serve as bit lines BL1 to BL9, and polysilicon layers 1802 perpendicular to the $N^+$ layers serve as control gates. Under the control gates, floating gates 1803 are formed such that they are located between the adjacent $N^+$ layers. In this manners the transistors of the memory cells are defined.

FIGS. 22B, 22C, 22D and 22E are sectional views taken along lines 22B—22B, 22C—22C, 22D—22D and 22E—22E of FIG. 22A, respectively.

The memory cells according to the present invention is featured in that a polysilicon layer 1804 biased to a predetermined potential level is formed on top of the memory cells. The polysilicon layer 1804 serves as a shield layer and prevents an inversion layer from being formed in regions which are between the $N^+$ layers and at which no control gate is present. Owing to the polysilicon layer 1804, an undesirable leak current is prevented from flowing between the memory cells. It should be noted that the shield layer is in no way restricted to the polysilicon layer 1804 described above. Any type of conductive layer, such as an aluminum layer, may be used instead of the polysilicon layer 1804, as long as the conductive layer serves to prevent a leak current.

In the embodiments shown in FIGS. 19–21, the first bit lines are formed of a diffusion layer, and the second bit lines are formed of aluminum. In the manufacturing process, the second bit lines are first formed, and then a conductive layer for shielding is formed, with an insulating film interposed.

The memory cells can be manufactured as follows. A semiconductor substrate is overlaid with an oxide film serving as a gate insulating film, and a polysilicon layer serving as a floating gate is formed on the oxide film. Next, the resultant structure is etched in a stripe pattern so as to selectively expose the surface of the semiconductor substrate. In this manner, regions where $N^+$ layers are to be formed redefined. The $N^+$ layers are formed, with the remaining portions of the polysilicon film as a mask. The $N^+$ layers are of the opposite conductivity type to that of the semiconductor substrate and serve as bit lines. Thereafter, an oxide film is formed on the polysilicon layer and on the exposed portions of the semiconductor substrate, and a polysilicon layer, serving as a control gate, is formed on the oxide film. A resist film is formed at those portions of the structure where word lines are to be formed. With the resist film as a mask, the polysilicon layer formed first (i.e., the lower polysilicon layer) is etched. By this etching, floating gates are allowed to remain under the control gates, and memory cells are thus formed.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

As described above, the virtual grounded type EEPROM according to the present invention programs data in the memory cell array by controlling the voltage of the control gates of the memory cells while maintaining a high potential state of the drains of the memory cells. By controlling the ON/OFF state of the memory cell in this manner, the floating gates are selectively permitted to store charges, for data programming. Since offset transistors can be eliminated from the EEPROM, the occupation area of the memory cell array can be as small as possible, and the manufacturing yield can be improved. In the EEPROM of the present invention, moreover, the data programming of the memory cell array is executed first with respect to the bit line at one end of the memory cell array, and is sequentially continued thereafter. Due to this feature, when the bit line adjacent to the programming-completed bit line is programmed, the drains need not be released from the charges stored therein. Even if the drains are kept applied with a high voltage, data is prevented from mistakenly written in the memory cells connected to the programming-completed bit line. Hence, the time required for data writing is not long in spite of the omission of offset transistors. According to the present invention, moreover, a conductive layer biased to a predetermined potential level is formed on top of the memory cells, with an insulating layer interposed. The conductive layer serves to prevent an inversion layer from being formed in regions which are between the bit lines and at which no control gate is present. Owing to the conductive layer, an undesirable leak current is prevented from flowing between the memory cells.

What is claimed is:

1. A nonvolatile semiconductor memory device comprising:
   a plurality of word lines;
   a plurality of bit lines;
   a memory cell array having a plurality of memory cells arranged in a matrix, each of the memory cells having a charge storage layer, a control gate, a drain, a source and a channel region, and storing data based on an amount of charges stored in the charge storage layer, the control gates of the memory cells of one row being connected to one of the word lines, adjacent ones of the memory cells of one row being connected such that the drain of one of the adjacent ones is connected to the source of the other, adjacent ones of the memory cells of one column being connected such that the drain of one of the adjacent ones and the source of the other are connected to one of the bit lines;
   a row decoder, supplied with an address signal, for selecting the word line;
   a column decoder, supplied with an address signal, for selecting the bit line; and
   a program circuit for programming data in the memory cells,
   said program circuit executing data programming such that data programming for the memory cells of one column is completed first and then data programming for the memory cells of an adjacent column is started, and such that data programming makes progress from the memory cells at one end of the memory cell array to the memory cells at the other end of the memory cell array.

2. A nonvolatile semiconductor memory device according to claim 1, in which the data is programmed into the memory cell by applying a high voltage to the drain of the memory cell and the high voltage is not discharged during the data programming for the memory cells of the memory cell array.

3. A nonvolatile semiconductor memory device according to claim 1, in which said row decoder, during programming, receives program data to be written in the memory cell and selects the word line in accordance with the address signal and the program data.

4. A nonvolatile semiconductor memory device according to claim 1, which further comprises a column selecting circuit for controlling connection between the bit line and the program circuit, and in which
   said bit lines include adjacent three bit lines arranged in the order of a first bit line, a second bit line and a third bit line, said program circuit applies a high voltage to the first bit line through the column selecting circuit and applies a reference potential to the second bit line, so as to program a memory cell whose drain is connected to the first bit line and whose source is connected to the second bit line, and then said program circuit applies a high voltage to the second bit line through the column selecting circuit and applies a reference potential to the third bit line, so as to program a memory cell whose drain is connected to the second bit line and whose source is connected to the third bit line.

5. A nonvolatile semiconductor memory device according to claim 4, in which said program circuit applies a high voltage both to the first bit line and to a bit line to which a programmed memory cell is connected, so as to program a memory cell whose drain is connected to the second bit line and whose source is connected to the third bit line.

6. A nonvolatile semiconductor memory device according to claim 4, in which said program circuit sets the first bit line and a bit line to which a programmed memory cell is connected an open state, so as to program a memory cell whose drain is connected to the second bit line and whose source is connected to the third bit line.

7. A nonvolatile semiconductor memory device according to claim 3, which further comprises a column selecting circuit for controlling connection between the bit lines and the program circuit, and in which
   said bit lines include adjacent three bit lines arranged in the order of a first bit line, a second bit line and a third bit line, said program circuit applies a high voltage to the first bit line through the column selecting circuit and applies a reference potential to the second bit line, so as to program a memory cell whose drain is connected to the first bit line and whose source is connected to the second bit line, and then said program circuit applies a high voltage to the second bit line through the column selecting circuit and applies a reference potential to the third bit line, so as to program a memory cell whose drain is connected to the second bit line and whose source is connected to the third bit line.

8. A nonvolatile semiconductor memory device according to claim 7, in which said program circuit applies a high voltage both to the first bit line and to a bit line to which a programmed memory cell is connected, so as to program a memory cell whose drain is connected to the second bit line and whose source is connected to the third bit line.

9. A nonvolatile semiconductor memory device according to claim 7, in which said program circuit sets the first bit line and a bit line to which a programmed memory cell is connected an open state, so as to program a memory cell whose drain is connected to the second bit line and whose source is connected to the third bit line.

10. A nonvolatile semiconductor memory device according to claim 3, which further comprises a power supply voltage-applying means capable of varying a level of a power source voltage applied to the row decoder, said power supply voltage-applying means generating a voltage corresponding to data to be programmed in the memory cell, and applying the voltage to a selected word line, thereby programming the data in the memory cell.

11. A nonvolatile semiconductor memory device according to claim 10, in which said power supply voltage-applying means applies the row decoder with a voltage lower than the power supply voltage applied at the time of normal data reading, when a data erased state of the memory cell is checked after the data programmed in the memory cell is erased.

12. A nonvolatile semiconductor memory device according to claim 3, in which said row decoder, during programming, selects a plurality of word lines.

13. A nonvolatile semiconductor memory device according to claim 12, which further comprises a latch circuit for storing data which is to be written in a selected memory cell.

14. A nonvolatile semiconductor memory device comprising:
a plurality of memory cell arrays each having a plurality of memory cells arranged in a matrix, each of the memory cells including a charge storage layer, a control gate, a drain, a source and a channel region, and storing data based on the amount of charges stored in the charge storage layer, control gates of the memory cells of one row being connected to one of word lines, adjacent ones of the memory cells of one row being connected such that the drain of one of the adjacent ones is connected to the source of the other, adjacent ones of the memory cells of one column being connected such that the drain of one of the adjacent ones and the source of the other are connected to one of first bit lines;
a plurality of second bit lines used in common to the memory cell arrays;
switching transistors having a first end which is connected to the corresponding first bit line of the memory cell array, and a second end which is connected to the corresponding second bit line;
a row decoder, supplied with an address signal, for selecting a word line;
a column decoder, supplied with an address signal, for selecting the second bit line; and
a program circuit for programming data in the memory cells, said program circuit executing data programming for the memory cell arrays connected to said second bit lines through said switching transistors such that data programming for the memory cells of one column is completed first and then data programming for the memory cells of an adjacent column is started, and such that data programming makes progress from the memory cells at one end of each memory cell array to the memory cells at the other end of the same memory cell array.

15. A nonvolatile semiconductor memory device according to claim 14, in which said switching transistors are connected to one end of each of the first bit lines extending in the same direction.

16. A nonvolatile semiconductor memory device according to claim 14, in which said switching transistors are connected at respective ends of the first bit lines, and said switching transistors used for selecting corresponding memory cell arrays are connected to the second bit lines.

17. A nonvolatile semiconductor memory device according to claim 14, in which program data to be written into the memory cell is supplied to said row decoder, a word line selected by the address signal is set to a high voltage or a reference voltage in accordance with the program data, and the program data is written into the memory cell by injecting charges into the charge storage layer or not based on a voltage level of the word line.

18. A nonvolatile semiconductor memory device according to any one of claims 14 to 17, in which said switching transistors of the memory cell arrays are simultaneously selected so as to execute simultaneous programming for the memory cell arrays.

19. A nonvolatile semiconductor memory device comprising:
a plurality of word lines;
a plurality of bit lines;
a memory cell array including a plurality of memory cells arranged in a matrix, each of the memory cells having a charge storage layer, a control gate, a drain, a source, and a channel region, and storing data in accordance with the amount of charges stored in the charge storage layer, the control gates of the memory cells of one row being connected to one of the word lines, adjacent ones of the memory cells of one row being connected such that the drain of one of the adjacent ones is connected to the source of the other, the memory cells of one column being connected such that the drains and sources thereof are connected in common to one of the bit lines;
a row decoder, supplied with an address signal, for selecting the word line;
a column decoder, supplied with an address signal, for selecting the bit line; and
a program circuit for programming data in the memory cells,
said program circuit applying a high voltage to the drain of a selected memory cell, said row decoder, during programming, receiving program data to be written in the memory cells and selecting the word line in accordance with an address signal and the program data.

20. A nonvolatile semiconductor memory device according to claim 19, in which said row decoder, during data programming, selects at least two word lines.

21. A nonvolatile semiconductor memory device according to claim 19, in which plural memory cell arrays are provided and corresponding memory cells in the plural memory cell arrays are simultaneously programmed.

22. A nonvolatile semiconductor memory device according to claim 19, in which said program circuit executes data programming such that data programming for the memory cells of one column is completed first and then data programming for the memory cells of an adjacent column is started, and such that data programming makes progress from the memory cells at one end of the memory cell array to the memory cells at the other end of the memory cell array.

23. A nonvolatile semiconductor memory device according to claim 22, in which the data is programmed into the memory cell by applying a high voltage to the drain of the memory cell and the high voltage is not discharged during the data programming for the memory cells of the memory cell array.

24. A semiconductor memory device comprising:
- a memory cell array having a plurality of memory cells arranged in a matrix;
- a plurality of word lines, each connected to a first predetermined number of said memory cells;
- a plurality of bit lines, each connected to a second predetermined number of said memory cells;
- a column decoder which selects at least one of said plurality of bit lines at a time of programming, a first predetermined voltage being applied to said selected bit line at the time of programming; and
- a row decoder which is supplied with a predetermined address signal and data to be programmed and selectively programs said data into at least one of said memory cells by selectively supplying a second predetermined voltage to at least one of said plurality of word lines according to said data to be programmed.

25. The semiconductor memory device according to claim 24, wherein said plurality of memory cells are nonvolatile memory cells.

26. The semiconductor memory device according to claim 24, wherein each of said plurality of memory cells includes a drain, a source and a gate, and the drain is connected to one of said plurality of bit lines.

27. The semiconductor memory device according to claim 24, wherein each of said plurality of memory cells includes a drain, a source and a gate, and the gate is connected to one of said plurality of word lines in order to program said data into at least one of said memory cells by supplying the predetermined voltage to said one of said plurality of word lines according to said data to be programmed at the time of programming.

28. The semiconductor memory device according to claim 27, wherein said data to be programmed are simultaneously programmed in said memory cells connected to said plurality of word lines.

29. The semiconductor memory device according to claim 28, wherein said memory cells that are programmed are connected to one of said plurality of bit lines.

30. The semiconductor memory device according to claim 24, further comprising a plurality of latch circuits that latch said data to be programmed.

31. The semiconductor memory device according to claim 30, wherein said data latched by said plurality of latch circuit are supplied to said row decoder at the time of programming.

32. The semiconductor memory device according to claim 24, wherein said row decoder comprises a decoder portion and a row driver portion and selectively programs said data into said at least one of said memory cells by selectively supplying the second predetermined voltage to said at least one of said plurality of word lines.

33. The semiconductor memory device according to claim 32, wherein said row driver portion is connected to said at least one of said plurality of word lines.

34. The semiconductor memory device according to claim 24, wherein said row decoder comprises a first decoding circuit and a second decoding circuit, said first decoding circuit receives a first address signal and said data to be programmed, said second decoding circuit receives a second address signal, and a word line selection gate receives a signal from said first decoding circuit and a signal from said second decoding circuit for driving said word line.

35. The semiconductor memory device according to claim 34, wherein said first decoding circuit receives a power supply voltage which is applied to said word line through said word line selection gate.

36. The semiconductor memory device according to claim 34, wherein said first decoding circuit receives a power supply voltage having one of a plurality of voltage levels, and said power source voltage having one of the voltage levels is applied to a selected word line by said row decoder.

37. The semiconductor memory device according to claim 34, wherein a conduction state of said word line selection gate is controlled by said second decoding circuit.

38. The semiconductor memory device according to claim 30, wherein said data are serially supplied, and each of said data is latched by said corresponding latch circuit.

39. The semiconductor memory device according to claim 38, wherein said serially-supplied data are simultaneously programmed.

40. The semiconductor memory device according to claim 38, wherein said latched data are applied to said row decoder.

41. The semiconductor memory device according to claim 38, wherein said latch circuit latches said data in response to a first control signal.

42. The semiconductor memory device according to claim 41, wherein said first control signal is generated in response to said address signal and a second control signal.

* * * * *